United States Patent
Saikawa et al.

(10) Patent No.: US 6,767,782 B2
(45) Date of Patent: Jul. 27, 2004

(54) MANUFACTURING METHOD OF SEMICONDUCTOR DEVICE

(75) Inventors: Takeshi Saikawa, Ome (JP); Ryohei Maeno, Ome (JP); Sadayuki Okudaira, Ome (JP); Tetsuo Saito, Tokorozawa (JP); Tsuyoshi Tamaru, Hachioji (JP); Kazutoshi Ohmori, Ome (JP)

(73) Assignees: Renesas Technology Corp., Tokyo (JP); Hitachi Tokyo Electronics Co., Ltd., Tokyo (JP)

( * ) Notice: Subject to any disclaimer, the term of this patent is extended or adjusted under 35 U.S.C. 154(b) by 0 days.

(21) Appl. No.: 10/082,311

(22) Filed: Feb. 26, 2002

(65) Prior Publication Data

US 2002/0168827 A1 Nov. 14, 2002

(30) Foreign Application Priority Data

May 11, 2001 (JP) .................................. 2001-140822

(51) Int. Cl.⁷ .......................................... H01L 21/8238
(52) U.S. Cl. ..................... 438/233; 438/402; 438/476; 438/906; 257/632
(58) Field of Search ................................ 438/167, 197, 438/233, 402, 457–459, 476, 906; 257/632–635, 639–645, 649–651

(56) References Cited

U.S. PATENT DOCUMENTS 5,227,339 A * 7/1993 Kishii ........................ 437/225
5,716,873 A * 2/1998 Prall et al. .................. 438/669
5,874,325 A * 2/1999 Koike ......................... 438/402
5,895,236 A * 4/1999 Yaoita ........................ 438/476
5,958,796 A * 9/1999 Prall et al. .................. 438/906
6,080,675 A * 6/2000 Prall et al. .................. 438/906
2002/0197762 A1 * 12/2002 Zosel et al. ................. 438/458

FOREIGN PATENT DOCUMENTS

| JP | 7-106306 | 4/1995 |
| JP | 8-111409 | 4/1996 |
| JP | 9-45680 | 2/1997 |
| JP | 2000-91175 | 3/2000 |
| JP | 2000-150640 | 5/2000 |

* cited by examiner

Primary Examiner—Lynne Gurley
(74) Attorney, Agent, or Firm—Miles & Stockbridge P.C.

(57) ABSTRACT

Charge-up damages to a substrate are reduced in a manufacturing process using plasma, and the reliability of a semiconductor device is improved.

By forming an insulating film on the back of a substrate before a step of forming a first wiring layer, even if a plasma CVD method, a sputtering method, or a dry-etching method is used in a wiring-forming step executed later, then it is possible to suppress electric charges which are generated on the substrate and which flow to the ground potential through the substrate, and to prevent damages to the substrate due to charge-up.

18 Claims, 34 Drawing Sheets

FIG.1A

|   |   |   |   |   |   | 3.2 | 3.5 | 3.3 |   |   |   |   |
|---|---|---|---|---|---|---|---|---|---|---|---|---|
|   |   |   |   | 3.0 | 2.5 | 3.9 | 3.8 | 3.5 | 2.5 | 3.4 |   |   |
|   |   |   | 3.8 | 5.2 | 5.2 | 5.2 | 5.2 | 5.2 | 5.2 | 2.4 | 3.1 |   |
|   |   | 2.3 | 5.2 | 5.2 | 5.2 | 5.2 | 5.2 | 5.2 | 5.2 | 5.2 | 2.4 | 2.5 |
|   |   | 2.5 | 5.2 | 5.2 | 5.2 | 5.2 | 5.2 | 5.2 | 5.2 | 5.2 | 3.2 | 2.4 |
| 2.6 | 3.3 | 5.2 | 5.2 | 5.2 | 5.2 | 5.2 | 5.2 | 5.2 | 5.2 | 5.2 | 2.8 | 2.5 |
| 2.7 | 2.1 | 5.2 | 5.2 | 5.2 | 5.2 | 5.2 | 5.2 | 5.2 | 5.2 | 5.2 | 3.1 | 2.5 |
| 2.7 | 2.7 | 4.1 | 5.2 | 5.2 | 5.2 | 5.2 | 5.2 | 5.2 | 5.2 | 5.2 | 2.7 | 2.8 |
|   |   | 2.5 | 3.1 | 5.2 | 5.2 | 5.2 | 5.2 | 5.2 | 5.2 | 5.2 | 2.9 | 2.7 |
|   |   | 2.2 | 2.6 | 3.3 | 5.2 | 5.2 | 5.2 | 5.2 | 5.2 | 5.1 | 2.6 | 2.9 |
|   |   |   | 3.0 | 2.7 | 5.2 | 4.2 | 3.8 | 4.4 | 4.2 | 3.9 | 2.7 |   |
|   |   |   |   | 2.5 | 1.8 | 3.2 | 3.1 | 3.0 | 2.6 | 2.2 |   |   |
|   |   |   |   |   |   | 2.4 | 2.7 | 2.7 |   |   |   |   |

FIG.1B

|   |   |   |   |   |   | 5.3 | 5.3 | 5.3 |   |   |   |   |
|---|---|---|---|---|---|---|---|---|---|---|---|---|
|   |   |   |   | 5.3 | 5.3 | 5.3 | 5.3 | 5.3 | 5.3 | 5.3 |   |   |
|   |   |   | 5.3 | 5.3 | 5.3 | 5.3 | 5.3 | 5.1 | 5.3 | 5.3 | 5.3 |   |
|   |   | 5.4 | 5.3 | 5.3 | 5.3 | 5.3 | 5.3 | 5.3 | 5.3 | 5.3 | 5.3 | 5.3 |
|   |   | 5.3 | 5.3 | 5.3 | 5.3 | 5.3 | 5.3 | 5.3 | 5.3 | 5.3 | 5.3 | 5.3 |
| 5.3 | 5.3 | 5.3 | 5.3 | 5.3 | 5.3 | 5.3 | 5.3 | 5.3 | 5.3 | 5.3 | 5.3 | 5.3 |
| 5.4 | 5.3 | 5.3 | 5.3 | 5.3 | 5.3 | 5.3 | 5.3 | 5.3 | 5.3 | 5.3 | 5.3 | 5.3 |
| 5.4 | 5.4 | 5.4 | 5.3 | 5.4 | 5.3 | 5.3 | 5.3 | 5.3 | 5.3 | 5.3 | 5.3 | 5.3 |
|   |   | 5.4 | 5.4 | 5.3 | 5.3 | 5.3 | 5.3 | 5.3 | 5.3 | 5.3 | 5.3 |   |
|   |   | 5.4 | 5.4 | 5.3 | 5.3 | 5.3 | 5.3 | 5.3 | 5.3 | 5.3 | 5.3 |   |
|   |   |   | 5.4 | 5.3 | 5.3 | 5.3 | 5.3 | 5.3 | 5.3 | 5.3 |   |   |
|   |   |   |   | 5.4 | 5.4 | 5.3 | 5.3 | 5.3 | 5.3 | 5.3 |   |   |
|   |   |   |   |   |   | 5.4 | 5.3 | 5.3 |   |   |   |   |

DISTANCE FROM END OF WAFER SURFACE (μm)

FIG.6

|   |   |   |   |   |   | 5.2 | 5.2 | 5.2 |   |   |   |   |
|---|---|---|---|---|---|-----|-----|-----|---|---|---|---|
|   |   |   |   | 5.2 | 5.2 | 3.3 | 5.2 | 4.0 | 5.2 | 5.2 |   |   |
|   |   |   | 5.2 | 5.2 | 2.8 | 4.0 | 4.1 | 3.3 | 3.5 | 3.9 | 5.2 |   |
|   |   | 5.2 | 5.2 | 5.2 | 2.8 | 2.6 | 2.4 | 2.8 | 3.1 | 2.8 | 3.0 | 5.2 |
|   |   | 5.2 | 5.2 | 4.1 | 3.1 | 3.2 | 2.3 | 2.4 | 3.0 | 3.5 | 3.0 | 5.2 |
| 5.2 | 5.2 | 5.2 | 5.1 | 2.3 | 2.1 | 2.2 | 2.5 | 2.2 | 3.8 | 3.9 | 5.2 | 5.2 |
| 5.2 | 5.2 | 5.1 | 2.7 | 2.7 | 2.0 | 1.4 | 1.8 | 2.0 | 2.6 | 2.7 | 5.2 | 5.2 |
| 5.2 | 5.2 | 5.2 | 4.0 | 2.7 | 3.0 | 2.1 | 3.2 | 3.1 | 4.0 | 3.1 | 5.2 | 5.2 |
|   |   | 5.2 | 5.2 | 3.5 | 3.5 | 3.8 | 2.6 | 3.0 | 3.0 | 3.9 | 5.2 | 5.2 |
|   |   | 5.2 | 5.2 | 5.2 | 5.1 | 2.8 | 3.5 | 3.5 | 3.3 | 3.4 | 5.2 | 5.2 |
|   |   |   | 5.2 | 5.2 | 5.2 | 3.5 | 3.8 | 2.6 | 5.2 | 5.2 | 5.2 |   |
|   |   |   |   | 5.2 | 5.2 | 5.2 | 5.2 | 5.2 | 5.2 | 5.2 |   |   |
|   |   |   |   |   |   | 5.2 | 5.2 | 5.2 |   |   |   |   |

FIG.7A
|   |   |   |   |   | 5.2 | 4.9 | 5.2 |   |   |   |   |
|---|---|---|---|---|---|---|---|---|---|---|---|
|   |   |   |   | 0.6 | 5.2 | 5.2 | 5.2 | 5.2 | 5.2 | 5.2 |   |
|   |   |   | 5.2 | 5.2 | 5.2 | 5.2 | 5.2 | 5.2 | 5.2 | 5.2 | 5.2 |
|   | 5.2 | 5.2 | 5.2 | 5.2 | 5.2 | 2.0 | 2.5 | 5.2 | 2.2 | 5.2 | 5.2 |
|   | 5.2 | 5.2 | 5.2 | 5.2 | 1.9 | 2.3 | 2.3 | 2.0 | 2.4 | 5.2 | 5.2 |
| 5.2 | 5.2 | 0.2 | 5.2 | 3.6 | 1.9 | 1.9 | 2.2 | 2.0 | 1.7 | 5.2 | 5.2 | 5.2 |
| 0.1 | 5.2 | 5.2 | 5.2 | 2.6 | 2.3 | 2.1 | 0.8 | 1.9 | 3.2 | 5.2 | 5.1 | 5.2 |
| 5.2 | 5.2 | 5.2 | 5.2 | 5.2 | 2.1 | 1.8 | 2.1 | 2.3 | 5.2 | 5.2 | 5.1 | 5.2 |
|   | 5.2 | 5.2 | 5.2 | 5.2 | 5.2 | 2.1 | 2.8 | 5.2 | 5.2 | 5.2 | 5.2 |
|   | 5.2 | 5.2 | 5.2 | 5.2 | 5.2 | 5.2 | 5.2 | 5.2 | 5.2 | 5.2 | 5.2 |
|   |   |   | 5.2 | 5.2 | 5.2 | 5.2 | 5.2 | 5.2 | 5.2 | 5.2 | 5.2 |
|   |   |   |   | 5.2 | 5.2 | 5.2 | 5.2 | 5.2 | 5.2 | 5.2 |   |
|   |   |   |   |   | 5.2 | 5.2 | 5.2 |   |   |   |   |
FIG.7B
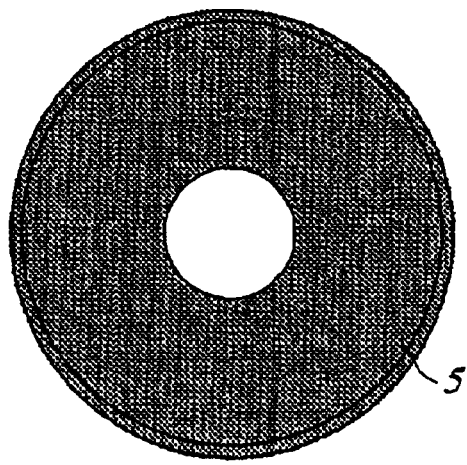
FIG.7C
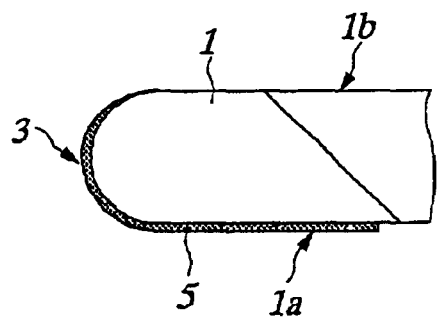

CURRENT PATH

MANUFACTURING METHOD OF SEMICONDUCTOR DEVICE

BACKGROUND OF THE INVENTION

The present invention relates to a manufacturing technique of a semiconductor device, and particularly to a technique to be effectively applied to a manufacturing method of a semiconductor device, which has a manufacturing process using plasma.

A thin gate insulating film is indispensable for a MISFET (Metal Insulator Semiconductor Field Effect Transistor). When the thickness of a gate insulating film decreases, the gate capacity per unit area increases and the coupling between a gate electrode and the surface of a substrate is improved and thereby a charge density and a drain current of an inversion layer are increased. That is, by decreasing the thickness of the gate insulating film, it is possible to improve the mutual conductance of the MISFET.

However, when the thickness of the gate insulating film is decreased to 10 nm or less, a breakdown phenomenon of the gate insulating film occurs and thereby the reliability of a semiconductor device is deteriorated. As a result of study by the present inventors, it has been clarified that particularly, the dielectric breakdown of a gate insulating film generated in a manufacturing process employing plasma used in a plasma CVD (Chemical Vapor Deposition) method or a plasma etching method or the like causes a serious problem.

Charge-up on a substrate due to electrons or positive ions generated by plasma is considered as one of the causes of the dielectric breakdown. That is, it has been estimated that the gate insulating film is broken because electric charges generated on a substrate due to a plasma reaction flow to a substrate and moreover to the ground potential through a susceptor of a manufacturing system on which the substrate is located. Therefore, to prevent occurrence of the above charge-up on the substrate, it is important to reduce electric charges flowing between the substrate and the susceptor of the manufacturing system by forming an insulating film therebetween.

Japanese Patent Laid-Open No. 7-106306 by Sasaki et al. discloses a method of using, in an ion etching system, a structure of attaching a polyimide film to the surface of a bottom electrode and of setting the wafer on the polyimide film and thereby dispersing a voltage applied to a wafer to the polyimide film, a blocking capacitor and the wafer.

Moreover, Japanese Patent Laid-Open No. 8-111409 by Nakajima et al. discloses a method of forming an oxide film made of a semiconductor wafer material on the back of a semiconductor wafer at least before a step of first forming a film on the surface of the semiconductor wafer through a CVD method, and leaving the oxide film on the back of the semiconductor wafer at least after a final film-forming step through a CVD method, and thereby suppressing the warpage of the semiconductor wafer.

Furthermore, Japanese Patent Laid-Open No. 9-45680 by Ogawa discloses a method for reducing the warping amount of a silicon-substrate wafer by forming a refractory metallic thin film on the surface of a semiconductor substrate and then depositing an insulating film having a tensile stress on the whole back of the semiconductor substrate.

Furthermore, Japanese Patent Laid-Open No. 2000-91175 by Matsumoto et al. discloses a method for preventing copper or the like produced due to a heat treatment from diffusing into a wafer by forming a protective film made of a material having a small copper (Cu) diffusion coefficient on the circumferential portion, outer peripheral surface, and back of the main surface of a wafer.

Furthermore, Japanese Patent Laid-Open No. 2000-150640 by Aoki discloses a method for forming a barrier film made of a silicon oxide film or the like on the back of the semiconductor substrate, and then forming a copper-based metallic film on the main surface of the semiconductor substrate, and thereby preventing characteristics of a device from deteriorating and a current therein from leaking due to metallic contaminant adhering to the back of a semiconductor substrate.

SUMMARY OF THE INVENTION

In the case of a manufacturing device using plasma, a wafer is mounted on a susceptor in a reaction chamber and fabricated through plasma CVD or plasma etching or the like. In general, the surface of a susceptor of a manufacturing system is covered with an insulating film having a thickness of about rf 10 $\mu$m and a wafer is insulated from the susceptor. However, as a result of study by the present inventor, it is clarified that an insulating film on a susceptor is deteriorated as the frequency of using the insulating film increases, a pinhole is locally formed, and a current path from a wafer to the susceptor is formed.

Moreover, a manufacturing device using plasma and adopting an electrostatic attraction system frequently uses conductive ceramic having a conductivity of tens to hundreds M$\Omega$cm for a susceptor in order to increase the attraction force of a wafer and make the wafer more easily separate from the susceptor. In this case, because electric charges easily flow between the wafer and the susceptor, it is impossible to avoid a problem of damages caused by charge-up.

Furthermore, various studies have been made of an insulating film formed between a wafer and the susceptor of a manufacturing system of, for example, an insulating film formed on the back of the wafer. However, the study for reducing charge-up generated on a substrate due to a plasma reaction including a manufacturing process of a semiconductor device has not been sufficiently made of so far. Therefore, reduction in charge-up due to plasma has been left as an important problem on a high integrated semiconductor device.

An object of the present invention is to provide a technique capable of reducing charge-up damages on a substrate in a manufacturing process using plasma and a technique capable of improving the reliability of a semiconductor device.

The above and other objects and novel features of the present invention will become more apparent from the description of this specification and the accompanying drawings.

The outline of a typical invention among inventions disclosed in this application will be briefly described below.

The present invention forms both a gate insulating film of a MISFET formed on a first main surface of a substrate and a first insulating film covering a gate electrode, then forms a second insulating film on a second main surface of a substrate, or a bevel portion of the substrate, or both the second main surface and the bevel portion of the substrate, and then forms a wiring layer on the first main surface of the substrate. It is preferable that the above-mentioned second insulating film is constituted by a TEOS oxide film, silicon nitride film, or silicon oxide film formed through CVD plasma and its thickness is about 100 nm or more.

Moreover, outlines of other inventions of this application will be briefly described below by classing them into items.

1. A manufacturing method of a semiconductor device, comprises (a) a step of forming a first insulating film on a first main surface of a substrate, (b) a step of forming a second insulating film on a second main surface of the substrate, and (c) a step of polishing the first insulating film through a CMP method, wherein a wiring layer is formed on the first main surface of the substrate after the step (c) is executed.
2. A manufacturing method of a semiconductor device, comprises (a) a step of forming a first insulating film on a first main surface of a substrate and then forming a connection hole in a predetermined area of the first insulating film, (b) a step of forming a metallic film on the first main surface of the substrate, (c) a step of forming a second insulating film on a second main surface of the substrate, and (d) a step of polishing the metallic film through a CMP method and forming a plug in the connection hole, wherein a wiring layer is formed on the first main surface of the substrate after the step (d) is executed.
3. The manufacturing method of a semiconductor device according to item 1 or 2, wherein the second insulating film covers a bevel portion of the substrate.
4. The manufacturing method of a semiconductor device according to item 1 or 2, wherein the second insulating film is a TEOS oxide film, a silicon nitride film, or a silicon oxide film formed through a plasma CVD method.
5. The manufacturing method of a semiconductor device according to item 1, wherein the substrate is cleaned before the step (c) is executed.
6. The manufacturing method of semiconductor device according to item 2, wherein the substrate is cleaned before the step (d) is executed.

BRIEF DESCRIPTION OF THE DRAWINGS

FIG. 1A is an illustration showing a voltage-resistant distribution of a gate insulating film of a MISFET when no insulating film is formed on the back of a wafer.

FIG. 1B is an illustration showing a voltage-resistant distribution of a gate insulating film of the MISFET when an insulating film is formed on the back of the wafer.

FIG. 6 is an illustration showing a voltage-resistant distribution of a gate insulating film of a MISFET when no insulating film is formed on the back and the bevel portion of a wafer.

FIG. 7A is an illustration showing a voltage-resistant distribution of a gate insulating film of a MISFET when an insulating film is formed on both a partial area of the back and the whole area of the bevel portion of a wafer.

FIG. 7B is a plan view of the back of the wafer.

FIG. 7C is a cross-sectional view of the circumferential portion of the wafer.

DESCRIPTION OF THE PREFERRED EMBODIMENTS

Figure 2:
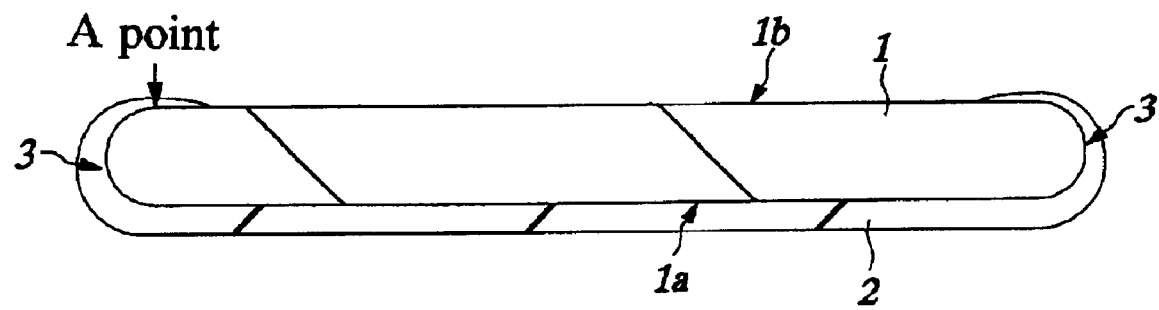
FIG. 2 is a cross-sectional view of a principal portion of a substrate showing an example of a covering of an insulating film formed on the back of a wafer by using a single-wafer plasma-CVD system.

Embodiments of the present invention will be described below in detail by referring to the accompanying drawings. In all drawings for describing the embodiments, members having the same function are provided with the same reference number and their repetitive description will be omitted.

In this application, a semiconductor device includes not only a semiconductor device formed on a single-crystal silicon substrate but also a semiconductor device formed on other substrates such as an SOI (Silicon On Insulator) substrate or a TFT (Thin Film Transistor) liquid-crystal manufacturing substrate or the like.

Moreover, the surface of a substrate in this application denotes a first main surface of a substrate on which a semiconductor integrated circuit will be formed, and the back of the substrate denotes a second main surface of the substrate serving as the back of the first main surface, and a bevel portion denotes a surface not included in a surface formed by extending the first main surface and a surface obtained by extending the second main surface.

Moreover, when referring to the number of factors (including the number of pieces, numerical values, quantities, and ranges) in the following embodiments, the number of factors is not restricted to the specified number but it may be equal to or more or less than the specified number unless otherwise specified or except the case where the number of factors is clearly restricted to a specified number in principle. Furthermore, it is needless to say that components (including factor steps) of the following embodiments are not necessarily indispensable unless otherwise specified or except the case where the components are clearly considered to be indispensable in principle. It is similar to the above numerical values and ranges.

Furthermore, when referring to shapes or positional relations of components of the following embodiments, the components substantially approximate to or similar to the shapes are included unless otherwise specified or except the case where the shapes or positional relations are clearly considered to be excluded in principle. The same can be applied to the above numerical value and range.

(Embodiment 1)

FIGS. 1A and 1B are illustrations showing an example of voltage-resistant (gate voltages at a gate current of $10^{-9}$ A) distributions, within the surface of a wafer, of a gate insulating film obtained from the gate-current versus gate-voltage characteristic of a MISFET formed on a wafer. The MISFET used for measurement is formed on an 8-inch wafer formed by single-crystal silicon and has a gate insulating film having a thickness of about 4 nm. Moreover, a first insulating film is formed on a gate electrode of the MISFET through a plasma CVD method using a plasma condition in which a charge-up damage becomes relatively large. Moreover, an antenna electrode having a size of about 20,000 times larger than a gate electrode and constituted by a conductive film on the same layer as the gate electrode is connected to each gate electrode. FIG. 1A shows a voltage-resistant distribution diagram of a gate insulating film of a MISFET when a second insulating film is not formed on the back of the wafer, and FIG. 1B shows a voltage-resistant distribution diagram of a gate insulating film of a MISFET when a second insulating film having a thickness of about 300 nm is formed on the back of the wafer before a first insulating film is formed. In FIG. 1A, respective areas surrounded by thick black frames denote chips which each have an voltage-resistant defect.

The above first insulating film is formed by a TEOS oxide film deposited through a plasma CVD method using TEOS (Tetra Ethylortho Silicate: $Si(OC_2H_5)$) and oxygen ($O_2$) as source gases by a parallel-plate plasma system. It can use, for example, a rf power of about 600 to 700W, a pressure of about 5 Torr as plasma condition of the first insulating film. The above second insulating film is formed by a TEOS oxide film deposited through a plasma CVD method using TEOS and oxygen as source gases, by using a parallel-plate plasma system, similarly to the first insulating film.

As shown in FIGS. 1A and 1B, it is found that by forming the second insulating film having a thickness of about 300 nm on the back of a wafer, the voltage-resistant yield of gate insulating films is improved, and charge-up damages at the time of forming a first insulating film are reduced, and voltage-resistant deterioration and dielectric breakdown of a relatively thin gate insulating film having a thickness of about 4 nm can be reduced.

Figure 3:
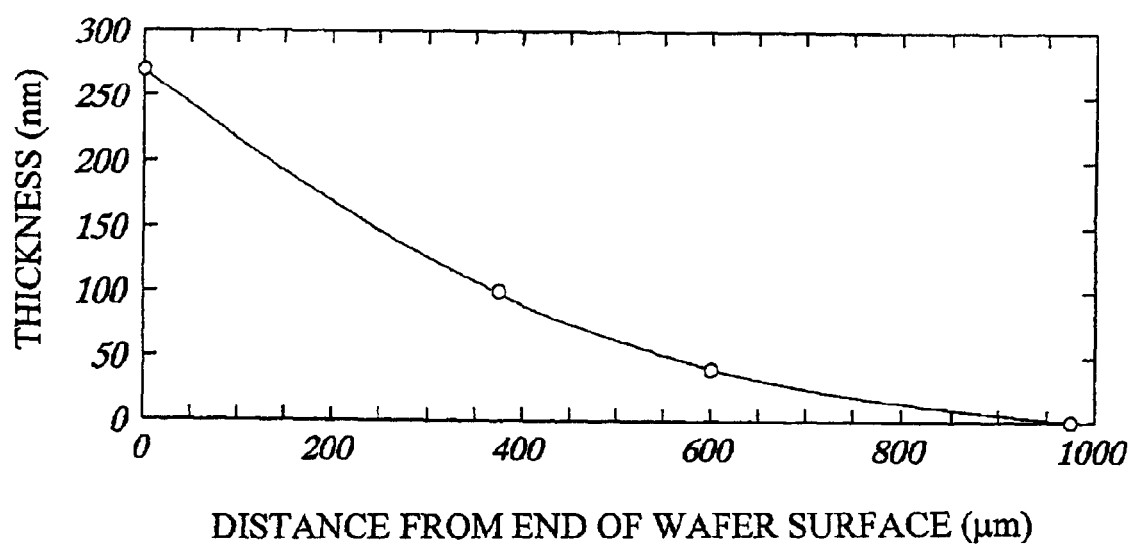
FIG. 3 is a graph showing the thickness of an insulating film covering the surface of a wafer from an end portion of the surface of the wafer toward the central portion thereof.

FIG. 2 is a cross-sectional view of an essential portion of a wafer showing an example of a covering property of a TEOS oxide film formed on the back of the wafer by using a single-wafer parallel-plate plasma CVD system, and FIG. 3 is a graph showing the thickness of a TEOS oxide film covering the surface of a wafer from an end (point A as shown in FIG. 2) of the surface of the wafer toward the central portion of the wafer.

As shown in FIG. 2, by forming a TEOS oxide film 2 having a thickness of about 2,000 nm on the back 1a of a wafer 1, a TEOS oxide film 2 having a thickness of about 1,400 nm is formed on a bevel portion 3. Moreover, as shown in FIG. 3, a TEOS oxide film 2 of about 250 to 300 nm is formed at an end point A of the surface 1b of the wafer 1, and formed on the circumferential portion up to about 1,000 μm from the end point A of the surface 1b of the wafer 1 as gradually thinning, and therefore it is possible to completely cover the bevel portion 3 with the TEOS oxide film 2.

Figure 4:
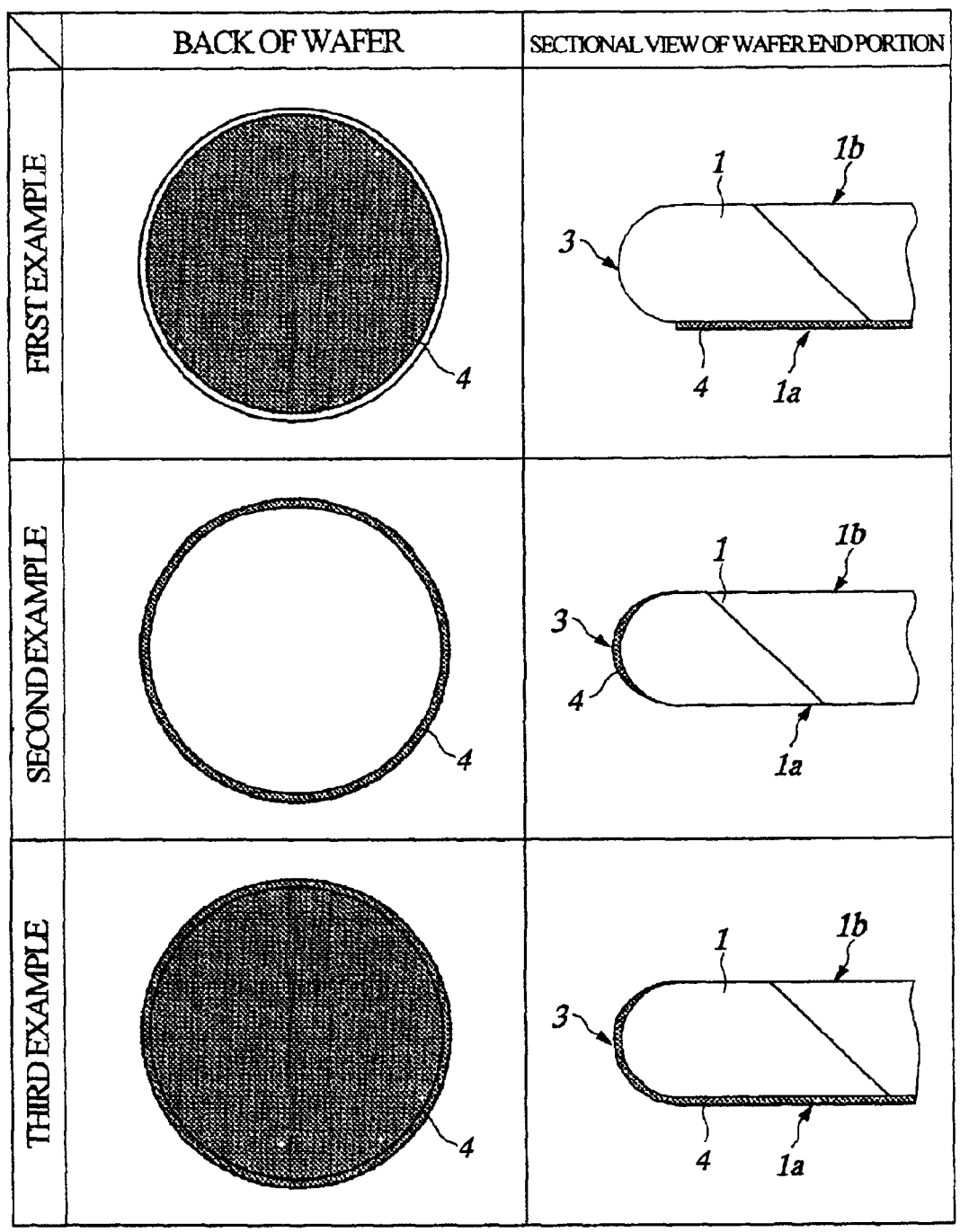
FIG. 4 is an illustration of plan views and partially cross-sectional views of the back of a wafer showing an insulating film formed on both the back and the bevel portion of the wafer.

FIG. 4 is a plan view and a partially cross-sectional view of a wafer showing a first example in which an insulating film is formed on the back of the wafer, a second example in which an insulating film is formed on the bevel portion of the wafer, and a third example in which an insulating film is formed on the back and the bevel portion of the wafer. In FIG. 4, areas in which an insulating film is formed are hatched.

Figure 5:
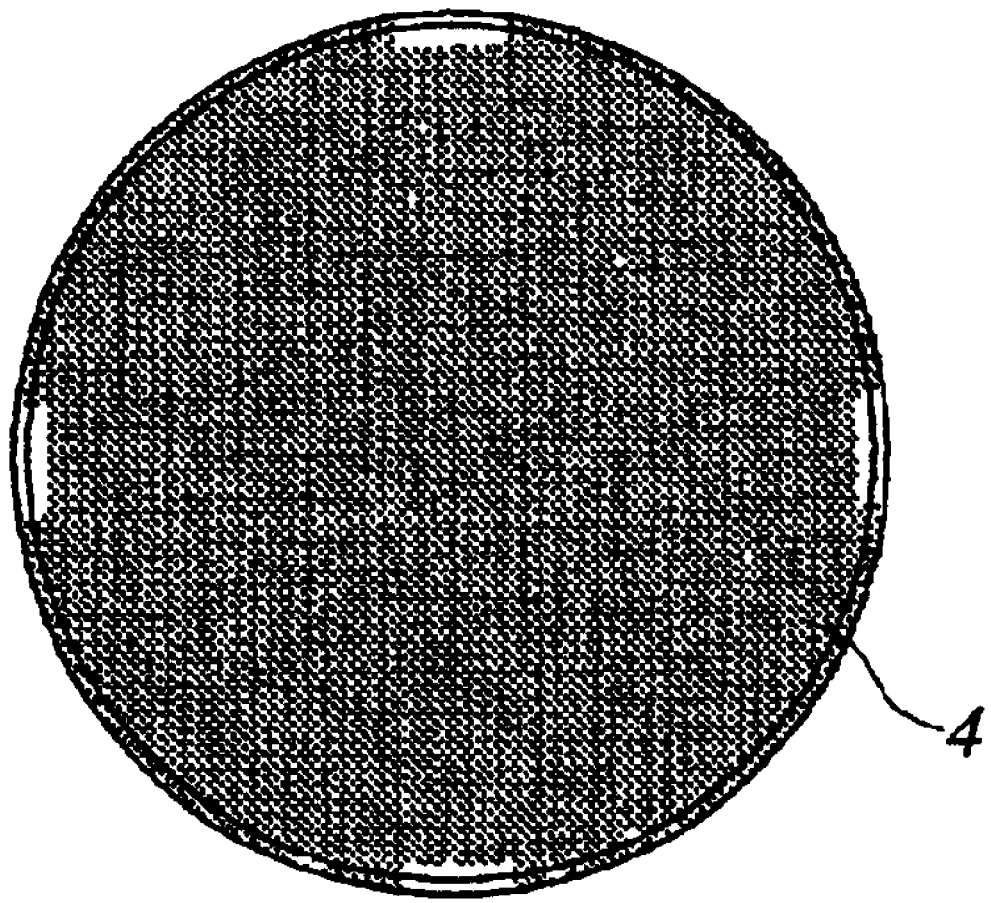
FIG. 5 is a plan view of the back of a wafer showing an insulating film formed on the back of the wafer.

FIG. 4 shows plan views of the wafer 1 when the insulating film 4 is formed on the whole area of the back 1a of the wafer 1, or the whole area of the bevel portion 3, or the whole areas of the back 1a and the bevel portion 3 of the wafer 1. However, the area on which the insulating film 4 will be formed is not always restricted to the whole area of the back 1a or the bevel portion 3. For example, an area where the insulating film 4 will not be formed may be a part of the back 1a or the bevel portion 3. For example, when an insulating film is formed on the back 1a of the wafer 1 by a batch-type thermal CVD system, as shown in FIG. 5, the insulting film 4 is not formed at a support portion of the wafer 1 but the wafer 1 is also included in the above third example. Moreover, it is possible to include both the wafer 1 in which the insulating film 4 is formed on the whole area of the back 1a and a partial area of the bevel portion 3 and the wafer 1 in which the insulating film 4 is formed on a partial area of the back 1a and the whole area of the bevel portion 3, in the above third example.

FIGS. 6 to 8 are illustrations showing examples of voltage-resistant distributions, within the surface of the wafer, of withstand voltages of gate insulating films obtained from the gate-current versus gate-voltage characteristics of the MISFET formed on the wafer. Though the MISFET and the measuring method used for measurement are the same as the MISFET described for FIG. 1, the first insulating film formed on the gate electrode is formed by a plasma system and a plasma condition different from the first insulating film described for FIG. 1.

Figure 8A:
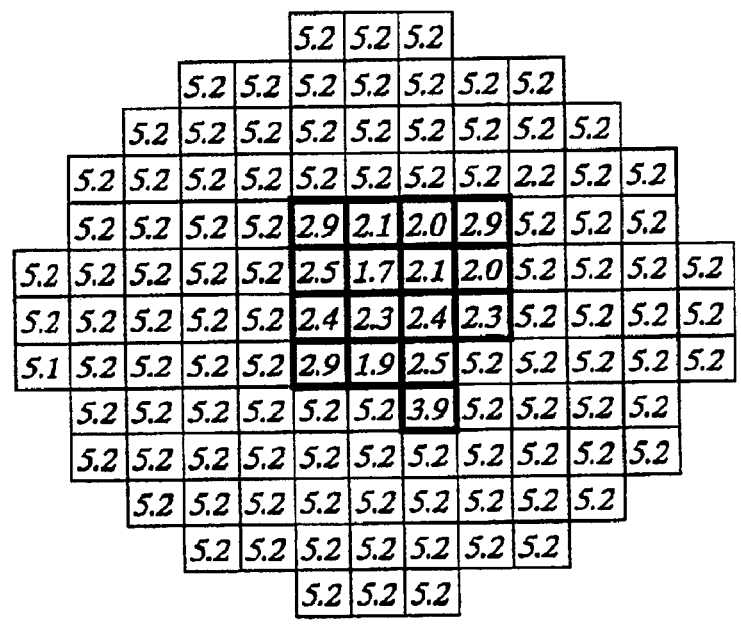
FIG. 8A is an illustration showing a voltage-resistant distribution of a gate insulating film of a MISFET when a second insulating film is formed on the whole area of the back of a wafer.
Figure 8B:
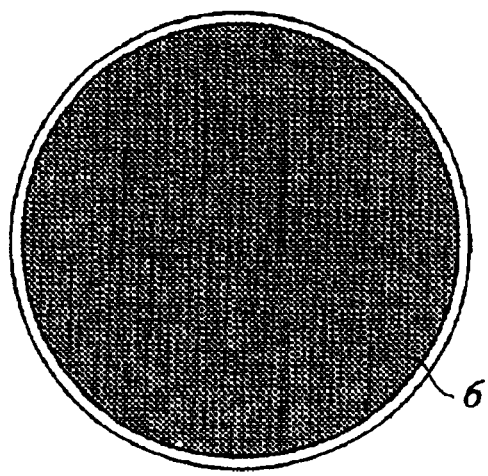
FIG. 8B is a plan view of the back of the wafer.
Figure 8C:
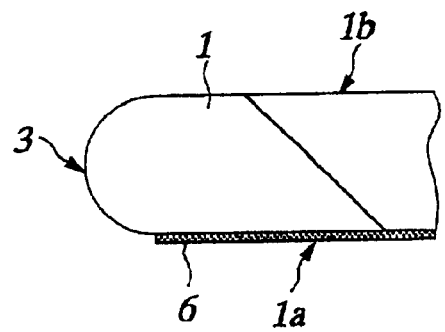
FIG. 8C is a cross-sectional view of the circumferential portion of the wafer.

FIG. 6 shows a voltage-resistant distribution diagram of a gate insulating film of a MISFET when a second insulating film is not formed on the back and the bevel portion of a wafer. FIGS. 7A to 7C show a voltage-resistant distribution diagram of a gate insulting film of a MISFET, a plan view of the back of a wafer, and a cross-sectional view of the circumferential portion of the wafer when a second insulating film is formed on a partial area of the back of the wafer and the whole area of a bevel portion before a first insulating film is formed. FIGS. 8A to 8C show a voltage-resistant distribution diagram of a gate insulating film of a MISFET, a plan view of the back of a wafer, and a cross-sectional view of he circumferential portion of the wafer when a second insulating film is formed on the whole area of the back of the wafer before a first insulating film is formed. In the case of voltage-resistant distribution diagrams of gate insulating films, chips each having a voltage-resistant defect are each surrounded by a bold black frame. In the case of cross-sectional views of circumferential portions of wafers, only wafers and second insulating films are shown. Moreover, in FIGS. 8B and 8C, areas for forming the second insulating film are hatched.

The second insulating film 5 shown in FIGS. 7A to 7C is formed by forming a TEOS oxide film on the whole areas of the back 1a and the bevel portion 3 of the wafer 1 so that the thickness of the film 5 becomes about 100 nm on the back 1a of the wafer 1, and then removing the TEOS oxide film at the central portion of the wafer 1 by wet-etching. Moreover, the second insulating film 6 shown in FIGS. 8A to 8C is formed by forming a TEOS oxide film on the whole areas of the back 1a and the bevel portion 3 of the wafer 1 so that the thickness of the film 5 becomes about 100 nm on the back 1a of the wafer 1, and then removing the TEOS oxide film of the bevel portion 3 by wet-etching.

As shown in FIGS. 6 to 8, by forming the second insulating film 5 on a partial area of the back 1a of the wafer 1 and the whole area of the bevel portion 3, the voltage-resistant yield of the gate insulating films is improved from 49.6% to 75.2%, and moreover by forming the second insulating film 6 on the whole area of the back 1a of the wafer 1, the voltage-resistant yield of the gate insulating films is improved from 49.6% to 86.8%. Thereby, by forming the second insulating films 5 and 6 on the back 1a or the bevel portion 3 of the wafer 1, it is found that charge-up damages at the time of forming a first insulating film are reduced.

Next, a mechanism for reducing charge-up damages in a plasma treatment by forming en insulating film on the back of a wafer will be described below by referring to FIG. 9.

Figure 9:
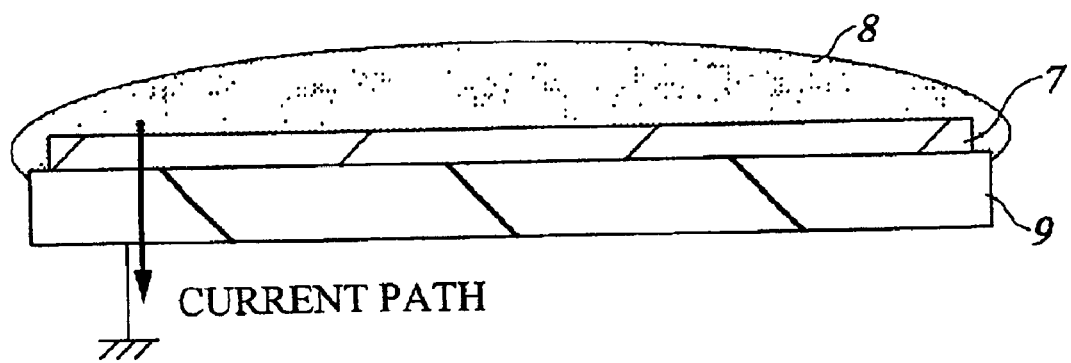
FIG. 9 is a schematic view for explaining a mechanism for reducing charge-up damages in a plasma treatment by forming an insulating film on the back of a wafer.

As shown in FIG. 9, when electric charges are accumulated on a wafer 7 due to the potential difference between the wafer 7 and plasma 8, it is estimated that the electric charges flow to the wafer 7 and moreover to the ground through a manufacturing device susceptor 9 on which the wafer 7 is mounted and thereby, for example, the gate insulating film of a MISFET is broken (a first mode). Therefore, by forming an insulating film on the back of the wafer 7, it is possible to cut off a current path and suppress charge-up.

Next, a mechanism for reducing charge-up damages in a plasma treatment by forming an insulating film on the bevel portion of a wafer will be described below by referring to FIG. 10.

Figure 10:
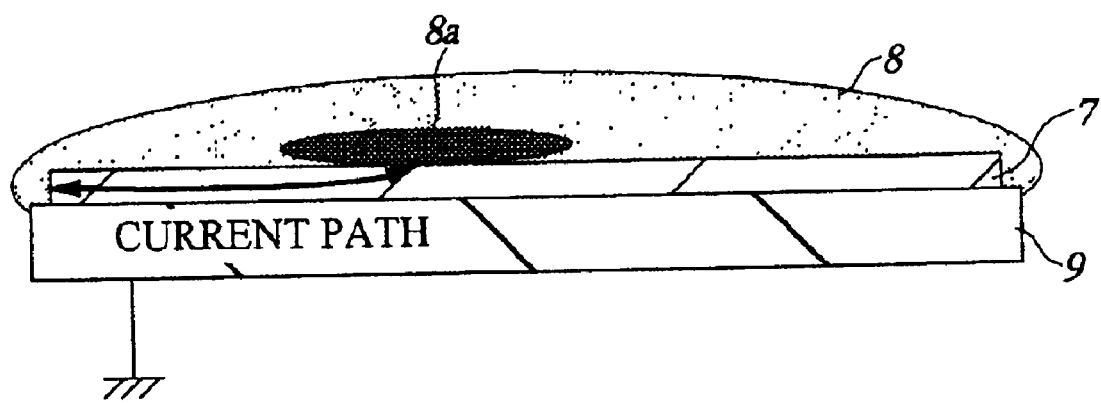
FIG. 10 is a schematic view for explaining a mechanism for reducing charge-up damages iii a plasma treatment by forming an insulating film on the bevel portion of a wafer.

As shown in FIG. 10, when plasma becomes non-uniform on the main surface of the wafer 7, it is estimated that a potential difference occurs between plasma 8 covering the bevel portion of the wafer 7 and plasma 8a on the main surface of the wafer 7, and electric charges flow through bulk of the wafer 7, and thereby, for example, the gate insulating film of a MISFET is broken (a second nods). Therefore, by forming an insulating film on the bevel portion of the wafer 7, it is possible to cut off a current path and suppress charge-up.

That is, because the insulating film formed on the back of the wafer is effective in the above-mentioned first mode and the insulating film formed on the bevel portion of the wafer is effective in the above-mentioned second mode, these insulating films independently contribute to reduction in charge-up damages. Therefore, it is estimated that it is the most effective in reduction in charge-up damages to form the insulating films on both the back and the bevel portion of a wafer.

Moreover, a degree of reducing effects on the charge-up damages by insulating films formed on the back and the bevel portion of the wafer depends on a manufacturing device causing charge-up damages. That is, in the case of the plasma treatment in which charge-up damages occur due to the potential difference between plasma and a wafer, the insulating film formed on the back of the wafer has a reducing effect on charge-up damages. In the case of the plasma treatment in which charge-up damages occur due to the non-uniformity of a plasma distribution within the surface of the wafer, the insulating film formed on the bevel portion of the wafer has a reducing effect on charge-up damages.

Next, a manufacturing method of a CMOS (Complementary Metal Oxide Semiconductor) device, which is the embodiment 1, viii be described below according to the order of steps by referring to sectional views of a principal portion of a substrate shown in FIGS. 11 to 26.

Figure 11:
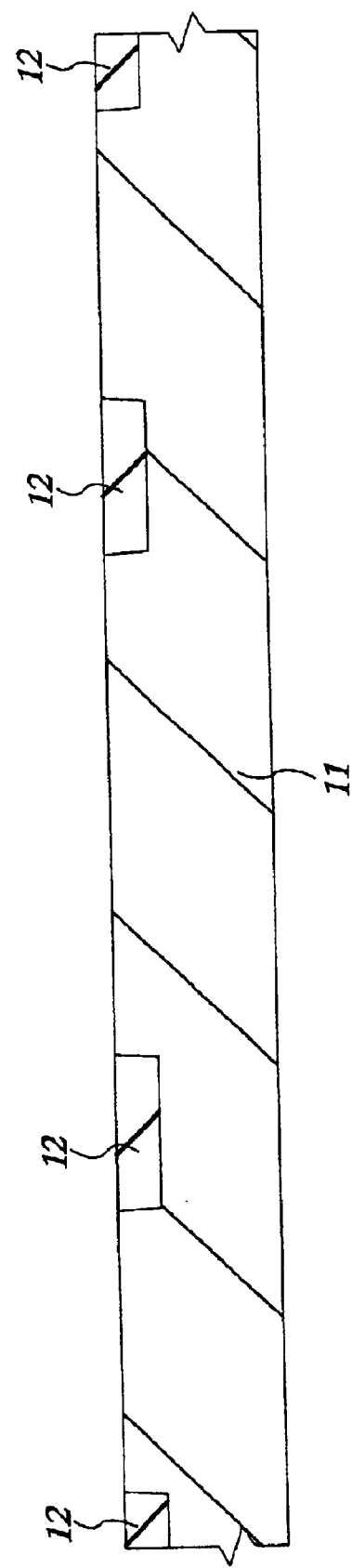
FIG. 11 is a cross-sectional view of a principal portion of a substrate showing a manufacturing method of a CMOS device that is embodiment 1.

First, as shown in FIG. 11, for example, a substrate 11 made of p⁻type single-crystal silicon is prepared. Then, this substrate 11 is thermally oxidized to form a thin silicon oxide film having a thickness of about 0.01 μm on the surface of the substrate 11, and then a silicon nitride film having a thickness of about 0.1 μm is deposited on the upper layer of the silicon oxide film through a CVD method. Thereafter, each device separation groove having a depth of about 0.35 μm is formed on the substrate 11 by using a patterned photoresist film as a mask and by dry-etching a silicon nitride film, a silicon oxide film, and the substrate 11 in this order.

Then, a silicon oxide film is deposited on the substrate 11 through a CVD method, and then each device separation area 12 is formed on the main surface of the substrate 11 by polishing the silicon oxide film through a CMP (Chemical Mechanical Polishing) method and thereby leaving the silicon oxide film in each device separation groove described above. Then, the silicon oxide film embedded in each device separation groove is densified.

Figure 12:
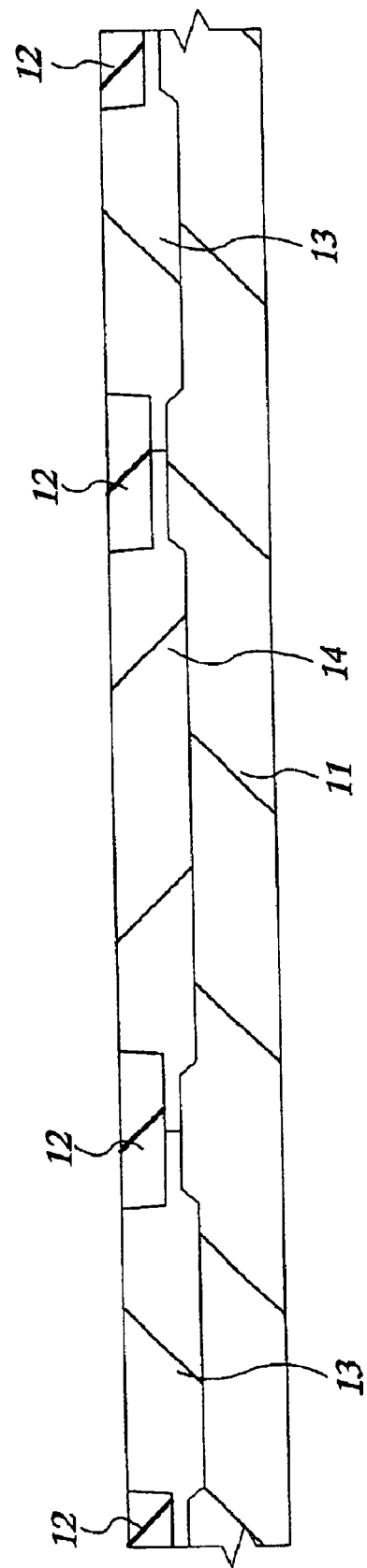
FIG. 12 is a cross-sectional view of a principal portion of a substrate showing a manufacturing method of a CMOS device that is embodiment 1.

Then, as shown in FIG. 12, each p well 13 and an n well 14 are formed by using a patterned photoresist film as a mask and by ion-implanting impurities. Impurities showing conductivity of a p type such as boron (B) are ion-implanted into each p well 13, and impurities showing conductivity of an n type such as phosphorus (P) are ion-implanted into the n well 14. Then, impurities for controlling the threshold value of a MISFET into each well region may be ion-implanted.

Figure 13:
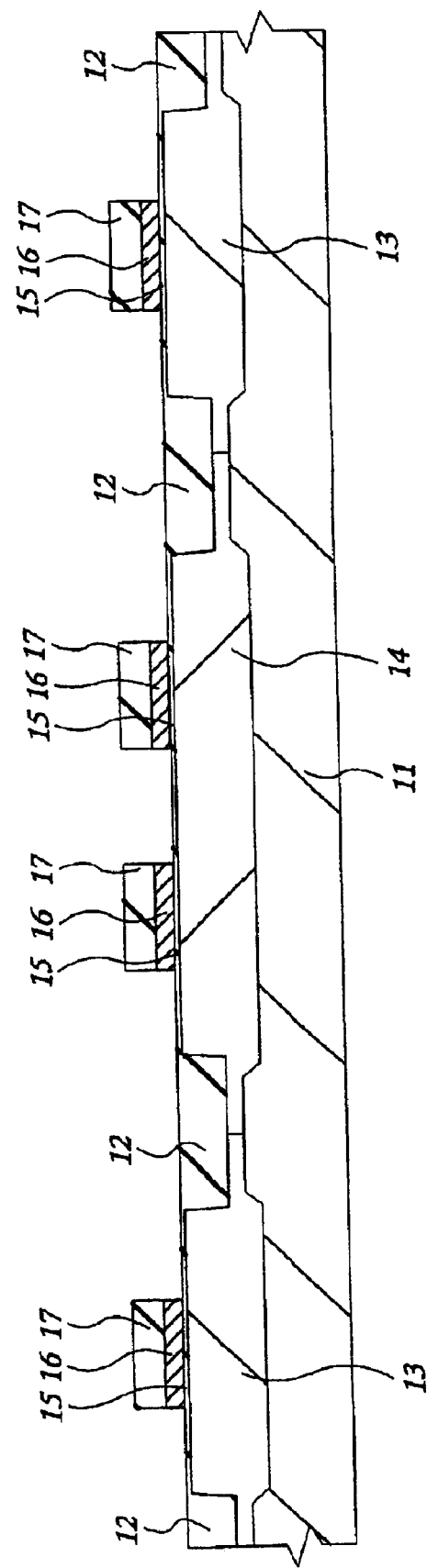
FIG. 13 is a cross-sectional view of a principal portion of a substrate showing a manufacturing method of a CMOS device that is embodiment 1.

Then, as shown in FIG. 13, a silicon oxide film serving as a gate insulating film 15, a polysilicon film serving a gate electrode 16, and a silicon oxide film serving as a cap insulating film 17 are deposited in this order to form a laminated film, and the above-mentioned laminated film is dry-etched by using a pattern photoresist film as a mask. Thereby, the gate insulating film 15, the gate electrode 16, and the cap insulating film 17 are formed, respectively. It is possible to form the gate insulating film 15 through a thermal oxidation method or a thermal CVD method, and the gate electrode 16 through, for example, a CVD method.

To decrease the resistance value of the gate electrode 16, the above-mentioned polysilicon film may be dropped by using n-type or p-type impurities in accordance with the channel type of a MISFET. That is, the gate electrode of an n-channel MISFET may be dropped by using n-type impurities, and the gate electrode of a p-channel MISFET may be dropped by using p-type impurities. Moreover, a refractory-metal silicide film may be laminated on the upper portion of the gate electrode 16, or a metallic layer made of tungsten (W) or the like may be formed on the gate electrode 16 through a barrier metal layer made of titanium nitride (TiN) or tungsten nitride (WN) or the like.

Figure 14:
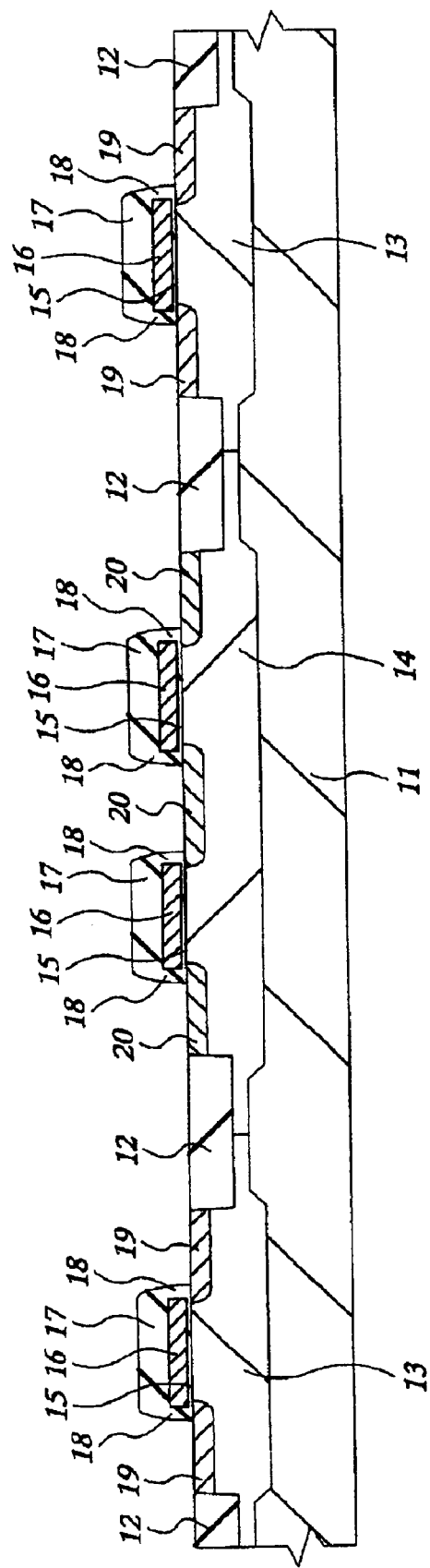
FIG. 14 is a cross-sectional view of a principal portion of a substrate showing a manufacturing method of a CMOS device that is embodiment 1.

Then, as shown in FIG. 14, each sidewall spacer 18 is formed on a sidewall of the gate electrode 16 by depositing a silicon oxide film on the substrate 11 through a CVD method or the like and then by anisotropy-etching this silicon oxide film. Then, n-type semiconductor regions 19 are formed in both sides of the gate electrode 16 on each p well 13 by using a patterned photoresist film as a mask and by ion-implanting n-type impurities (such as phosphorus or arsenic (As)) into each p well 13. The n-type semiconductor regions 19 are each formed in a self-aligning manner for the gate electrode 16 and sidewall spacer 18, and each function as the source and drain of an n-channel MISFET.

Similarly, p-type semiconductor regions 20 are formed on both sides of the gate electrode 16 on the n-well 14 by using a patterned photoresist film as a mask and by ion-implanting p-type impurities (such as boron fluoride ($BF_2$)) into the n well 14. Each p-type semiconductor region 20 is formed in a self-aligning manner for the gate electrode 16 and sidewall spacer 18, and functions as the source and drain of a p-channel MISFET.

Figure 15:
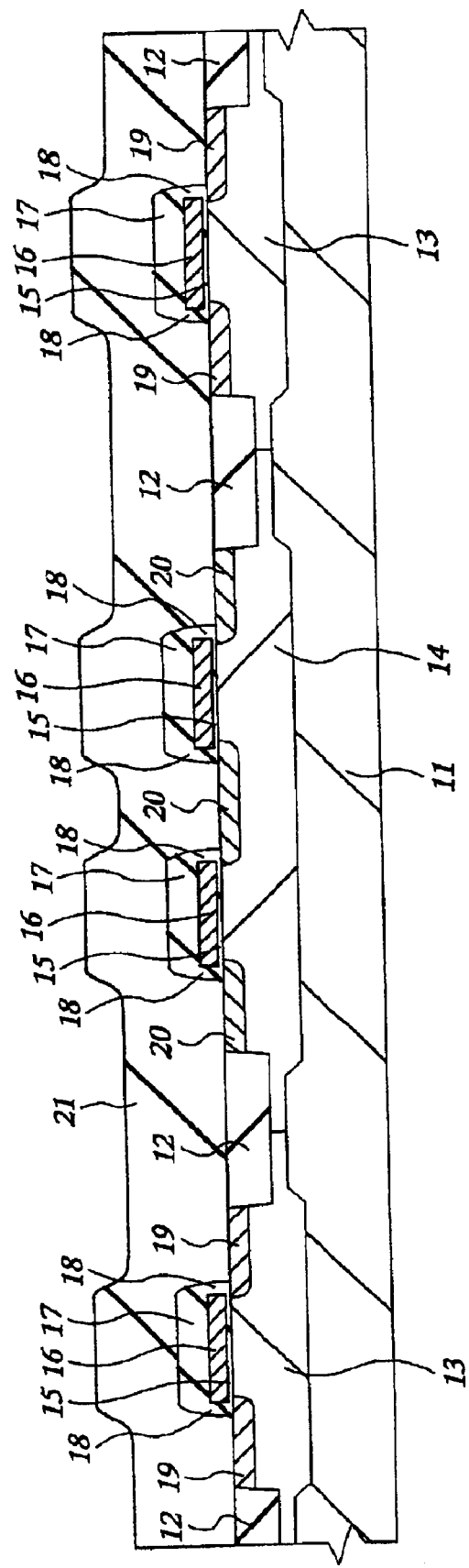
FIG. 15 is a cross-sectional view of a principal portion of a substrate showing a manufacturing method of a CMOS device that is embodiment 1.

Then, as shown in FIG. 15, a silicon oxide film 21 is formed over the substrate 11. The silicon oxide film 21 is constituted by, for example, a TEOS oxide film deposited through a plasma CVD method using TEOS and oxygen as source gases, or a silicon oxide film deposited through a high-density plasma CVD method using monosilane ($SiH_4$) and oxygen as source gases. In this case, even if a plasma reaction having a relatively large charge-up damage is used to form the silicon oxide film 21, a quantity of electric charges collected on an electrode is relatively small and the gate insulating film 15 is not easily broken because the electrode (gate electrode 16) contacting with the gate insulating film 15 of a MISFET on the substrate 11 does not have an antenna structure.

Figure 16:
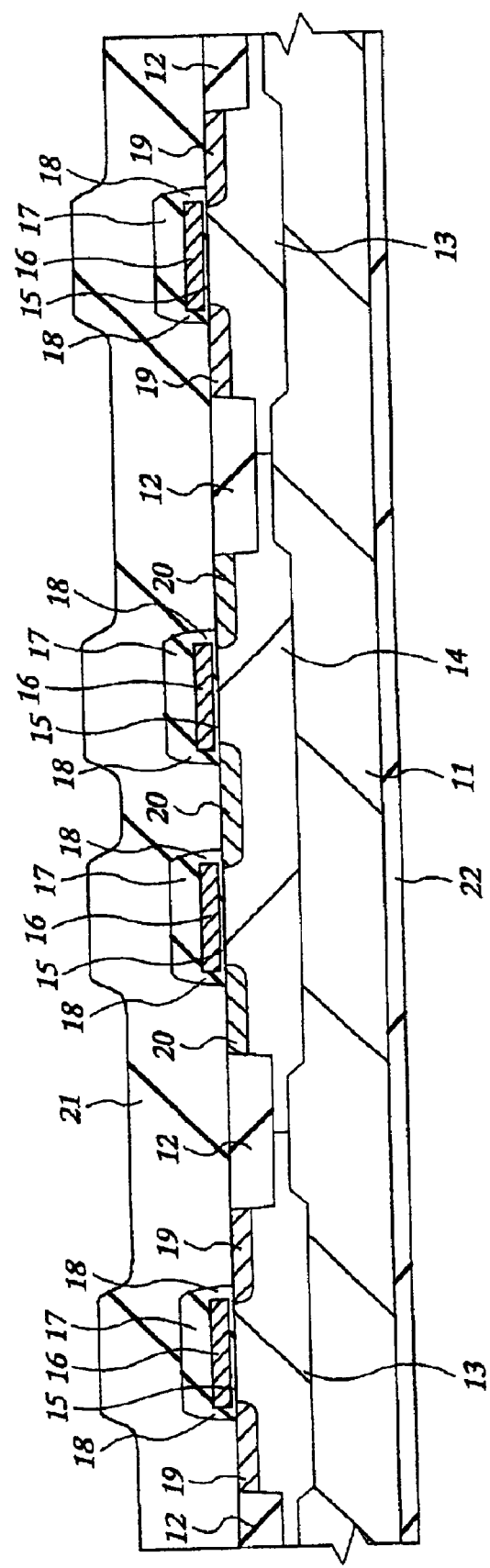
FIG. 16 is a cross-sectional view of a principal portion of a substrate showing a manufacturing method of a CMOS device that is embodiment 1.

Then, as shown in FIG. 16, an insulating film 22 having, for example, a thickness of about 300 nm is formed on the back of the substrate 11. The insulating film 22 can be formed by a TEOS oxide film, a silicon nitride film, or a silicon oxide film deposited through a plasma CVD method. The insulating film 22 is formed by setting the substrate 11 with its back turned upward, on the susceptor in the reaction chamber of a single-wafer parallel-plate plasma system. Thereby, the insulating film 22 is mainly formed on the back and the bevel portion of the substrate 11.

Figure 17:
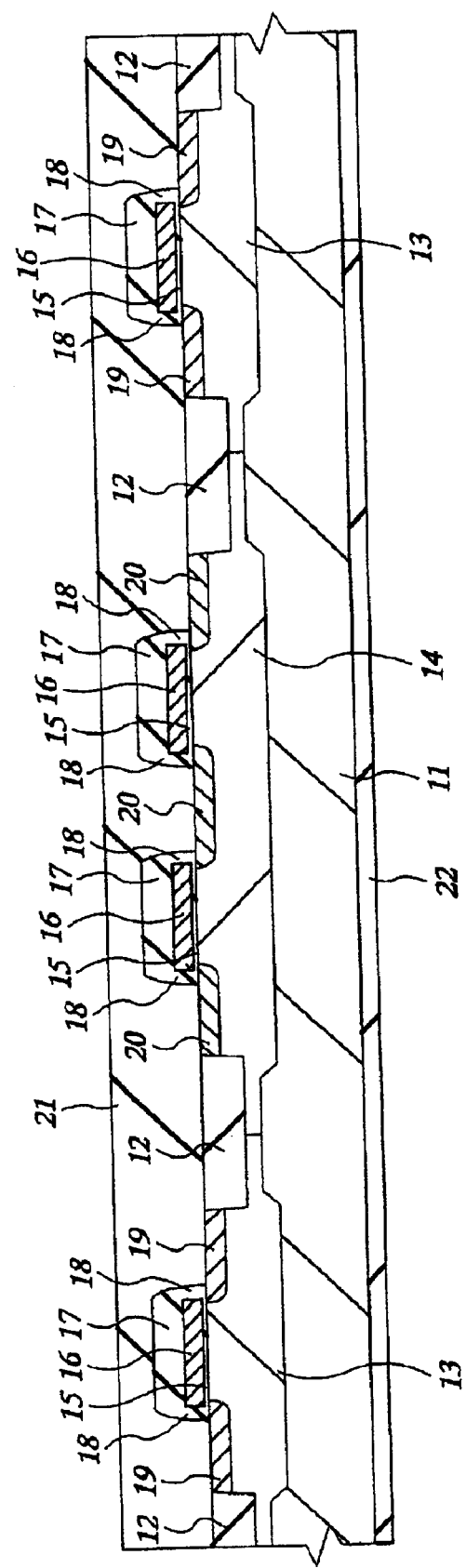
FIG. 17 is a cross-sectional view of a principal portion of a substrate showing a manufacturing method of a CMOS device that is embodiment 1.

Then, as shown in FIG. 17, the surface of the silicon oxide film 21 is flattened by polishing the silicon oxide film 21 through, for example, a CMP method, and, at the same time, particles adhering to the surface of the substrate 11 (surface of the silicon oxide film 21) are removed. That is, as described above, the particles adhere to the surface of the substrate 11 because the substrate 11 with its surface turned downward is mounted on the susceptor of the plasma system at the time of forming the insulating film 22 on the back of the substrate 11. However, by forming the insulating film 22 on the back of the substrate 11 and thereafter polishing the surface of the silicon oxide film 21 through a CMP method, it is possible to serve a step of flattening the surface of the silicon oxide film 21, also as a step of removing the particles. Moreover, a cleaning step may be set before the surface of the silicon oxide film 21 is polished through a CMP method.

Figure 18:
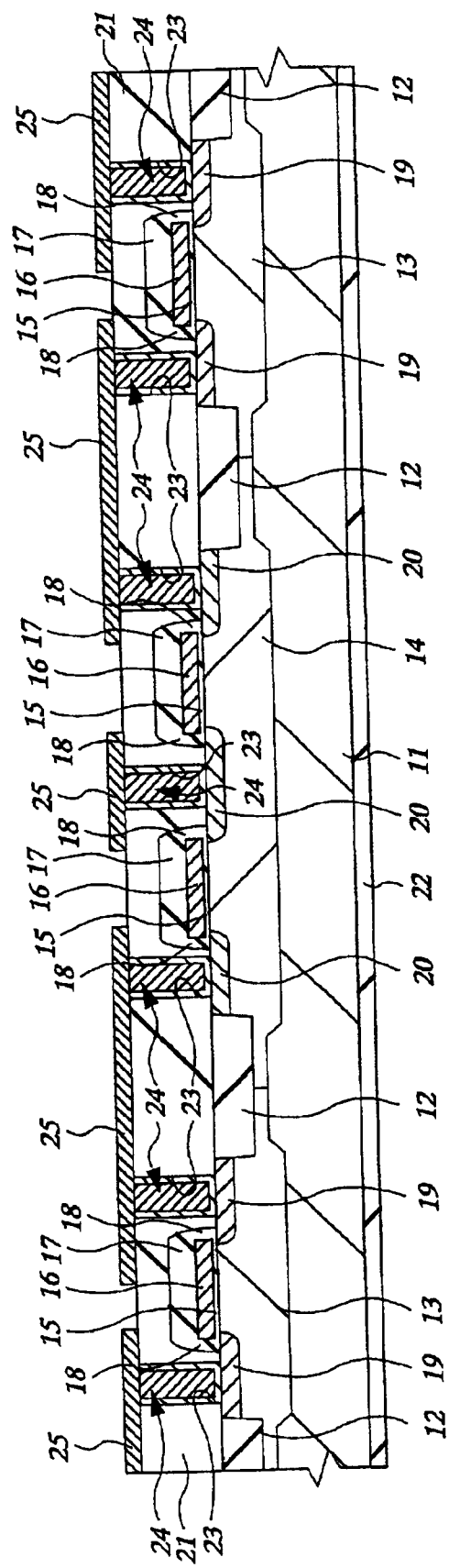
FIG. 18 is a cross-sectional view of a principal portion of a substrate showing a manufacturing method of a CMOS device that is embodiment 1.

Then, as shown in FIG. 18, each connection hole 23 is formed in the silicon oxide film 21 through a dry-etching method using a patterned photoresist film as a mask. Each connection hole 23 is formed on a necessary portion such as the gate electrode 16, n-type semiconductor region 19, the p-type semiconductor region 20 or the like.

Then, a titanium nitride film is formed through, for example, a CVD method on the entire surface of the substrate 11 including the inside of each connection hole 23, and moreover a tungsten film embedded in each connection hole 23 is formed through, for example, a CVD method. Thereafter, the titanium nitride film and tungsten film are removed from areas other than the connection holes 23 through, for example, a CMP method to form plugs 24 in the connection holes 23. Each plug 24 may be formed by using an aluminum (Al) film or a copper film as a main conductor layer instead of the above tungsten film.

Then, a tungsten film is formed over the entire surface of the substrate 11, and then processed through a dry-etching method using a patterned photoresist film as a mask to form each wiring 25 of a first wiring layer. The tungsten film can be formed through a CVD method or a sputtering method.

The first wiring layer may be constituted by using an aluminum film as a main conductor layer instead of the above tungsten film.

By forming each wiring 25 of the first wiring layer, antenna effects are generated due to each wiring 25 connected to each gate electrode 16, and the dielectric breakdown of the gate insulating film 15 of a MISFET, and the like may occur due to charge-up damages, in a step described later, that is, a film-forming step according to a plasma CVD method or a sputtering method or a processing step according to a dry-etching method. However, charge-up damages are reduced, by the insulating film 22 formed on the back and the bevel portion of the substrate 11 before a CMP step of the silicon oxide film 21, and thereby it is possible to prevent the breakdown of the gate insulting film 15 described above.

Figure 19:
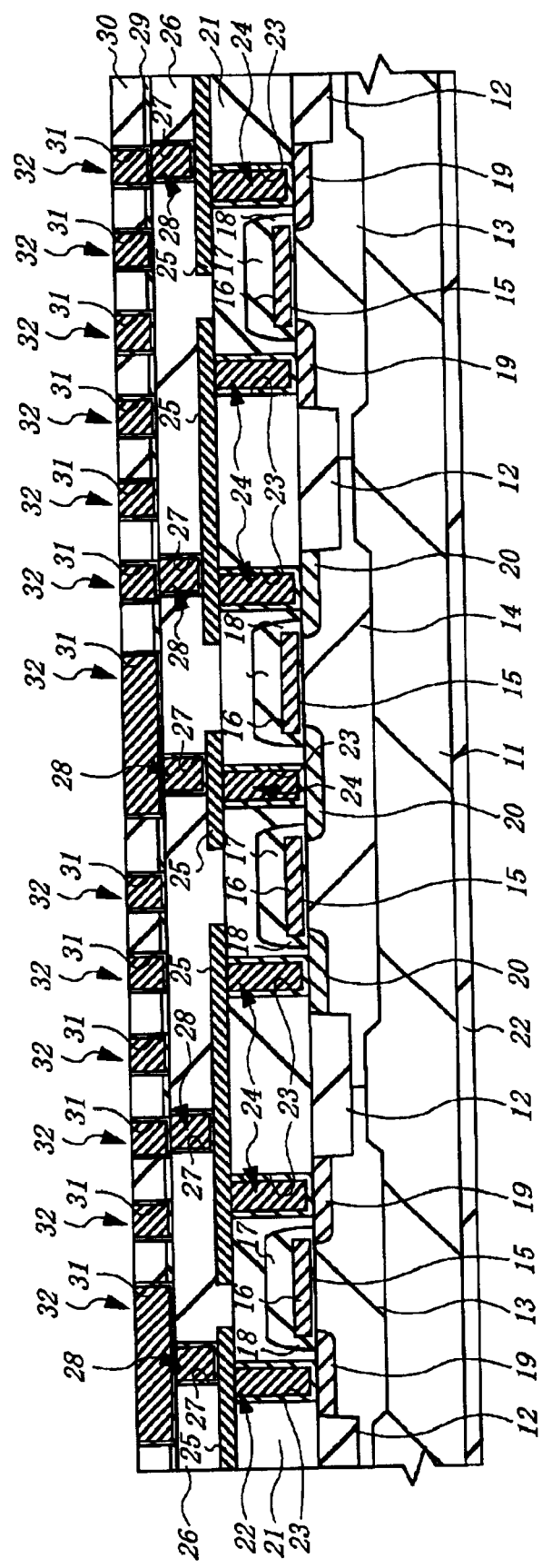
FIG. 19 is a cross-sectional view of a principal portion of a substrate showing a manufacturing method of a CMOS device that is embodiment 1.

Then, as shown in FIG. 19, an interlayer dielectric 26 whose surface is flattened is formed by forming an insulating film covering each wiring 25, for example, a TEOS oxide film formed through a plasma CVD method and then by polishing the insulating film through, for example, a CMP method. Then, each connection hole 27 is formed in the interlayer dielectric 26 through a dry-etching method using a patterned photoresist film as a mask.

Then, a barrier metal layer (not illustrated) is formed over the entire surface of the substrate 11 including the inside of the connection holes 27, and moreover a copper film embedded in each connection hole 27 is formed. The barrier metal layer is made of, for example, titanium nitride, tantalum (Ta), tantalum nitride (TaN) or the like and formed through, for example, a CVD method or a sputtering method. The copper film functions as a main conductor layer, which can be formed through a plating method. Before formation of the copper film through a plating method, a thin copper film can be formed as a seed layer through, for example, a CVD method or a sputtering method. Either method of electrolytic plating and electroless plating may be used for the above plating method. Then, plugs 28 are formed by removing the copper films (plated layer and seed layer) and the barrier metal layer from areas other than the connection holes 27 trough, for example, a CMP method.

Then, a stopper insulating film 29 is formed on the interlayer dielectric 26 and each plug 28, and moreover an insulating film 30 for forming a wiring is formed thereon. The stopper insulating film 29 serves as an etching stopper when grooves in the insulating film 30 are formed, and a material having an etching selection ratio is used relative to the insulating film 30. The stopper insulating film 29 is the silicon oxide film formed through, for example, a plasma CVD method, and the insulating film 30 is the silicon oxide film formed through, for example, a plasma CVD method. A second wiring layer to be described later is formed over the stopper insulating film 29 and the insulating film 30. Therefore, the total film thickness is decided by a designed film thickness necessary for a second wiring layer. Then, each wiring groove 31 is formed on predetermined areas of the stopper insulating film 29 and the insulating film 30 through a dry-etching method using a patterned photoresist film as a mask.

Then, a barrier metal layer (not illustrated) is formed over the entire surface of the substrate 11 including the insides of the wiring grooves 31, and moreover a copper film embedded in each wiring groove 31 is formed. The barrier metal layer is made of, for example, titanium nitride, tantalum, tantalum nitride or the like, and formed through, for example, a CVD method or a sputtering method. The copper film functions as a main conductor layer, which can be formed through a plating method. A thin copper film can be formed as a seed layer through, for example, a CVD method or a sputtering method before the copper film is formed through a plating method. Though formation of the copper film (plated layer) through a plating method is described above, the copper film is formed through a sputtering method. In this case, the above-mentioned seed layer is unnecessary. If a copper film is formed through a sputtering method, it is possible to thermally treat copper so that copper is embedded in each wiring groove 31, and to made the copper reflow. Thereafter, the copper films (plated layer and seed layer) and the barrier metal layer are removed from areas other than each wiring groove 31 through, for example, a CMP method to form each wiring 32.

Figure 20:
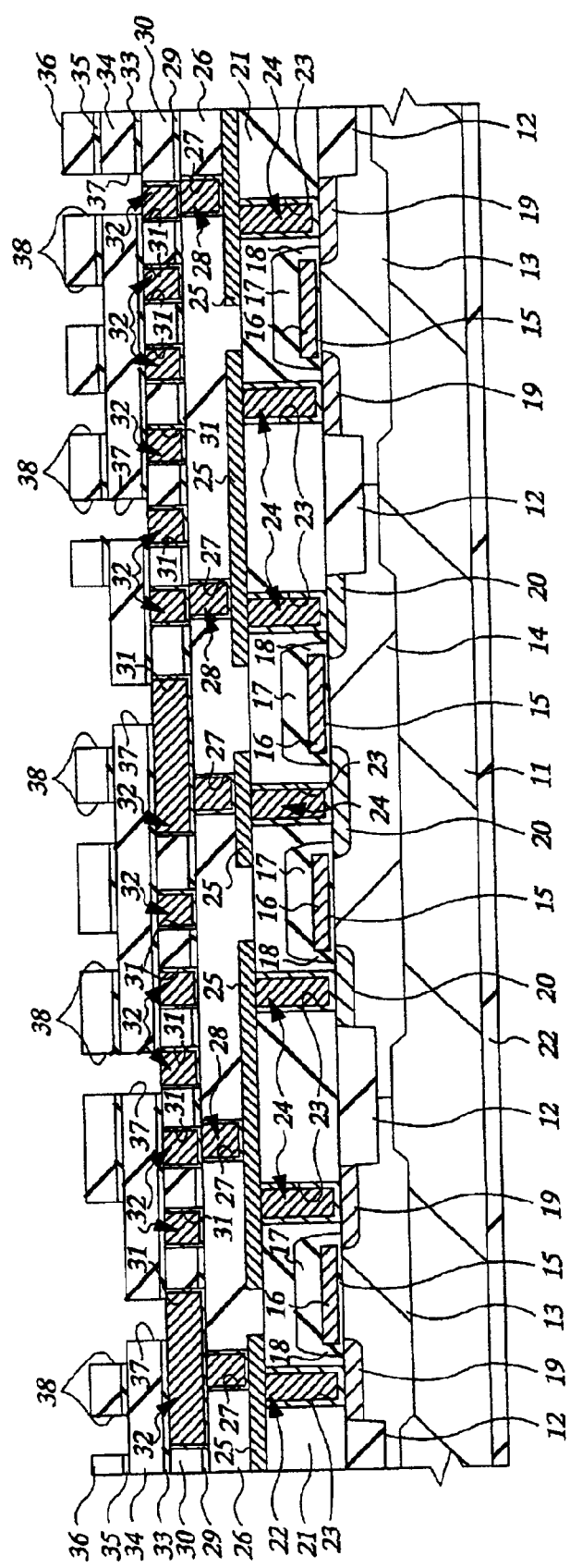
FIG. 20 is a cross-sectional view of a principal portion of a substrate showing a manufacturing method of a CMOS device that is embodiment 1.

Then, a third wiring layer is formed through a dual damascene method. First, as shown in FIG. 20, a cap insulating film 33, an interlayer dielectric 34, a stopper insulating film 35 for forming wirings, and an insulating film 36 for forming wirings are formed in this order on the insulating film 30 and the wirings 32 of the second wiring layer.

Each connection hole 37 is formed in the cap insulating film 33 and the interlayer dielectric 34 as described later. The cap insulating film 33 is formed by a material having an etching selection ratio to the interlayer dielectric 34, which can be used as a silicon nitride film formed through, for example, a plasma CVD method. The interlayer dielectric 34 is formed by a silicon oxide film or the like, which can be used as a TEOS oxide film formed through, for example, a plasma CVD method.

Each wiring groove 38 is formed in the stopper insulating film 35 and the insulating film 36 as described later. The stopper insulating film 35 is formed by a material having an etching selection ratio to the insulating film 36 (and the interlayer dielectric 34), which can be used as a silicon nitride film formed through, for example, a plasma CVD method. The insulating film 36 is formed by a silicon oxide film or the like, which can be used as a TEOS oxide film formed through, for example, a plasma CVD method. Each wiring groove 38 in which a third wiring layer to be described later will be embedded is formed in the stopper insulating film 35 and the insulating film 36. Therefore, the total film thickness is decided by a designed film thickness necessary for the third wiring layer.

Then, the connection holes 37 can be formed in the cap insulating film 33 and the interlayer dielectric 34, and the wiring grooves 38 can be formed in the stopper insulating film 35 and the insulating film 36, for example, as follows.

First, deep connection holes reaching the wirings 32 are formed in the cap insulating film 33 and the interlayer dielectric 34. Each of these connection holes is formed by forming a photoresist film patterned as corresponding to a hole pattern on the insulating film 36 and using this photoresist film as a mask and thereby dry-etching the insulating film 36, the stop insulating film 35, the interlayer dielectric 34, and the cap insulating film 33 in this order. Then, similarly to the case of forming the above-mentioned connection holes, a photoresist film patterned as corresponding to a groove pattern is formed in the insulating film 36, and the insulating film 36 and the stopper insulating film 35 are dry-etched in this order by using this photoresist film as a mask.

Then, wirings 39 of the third wiring layer are formed in the connection holes 37 and the wring grooves 38. Each wiring 39 is formed by a barrier metal layer and a copper film serving as a main conductor layer and a connection member for connecting each wiring 39 to each wiring 32 serving as a lower-layer wiring is formed integrally with each wiring 39. The wirings 39 are formed, for example, as described below.

Figure 21:
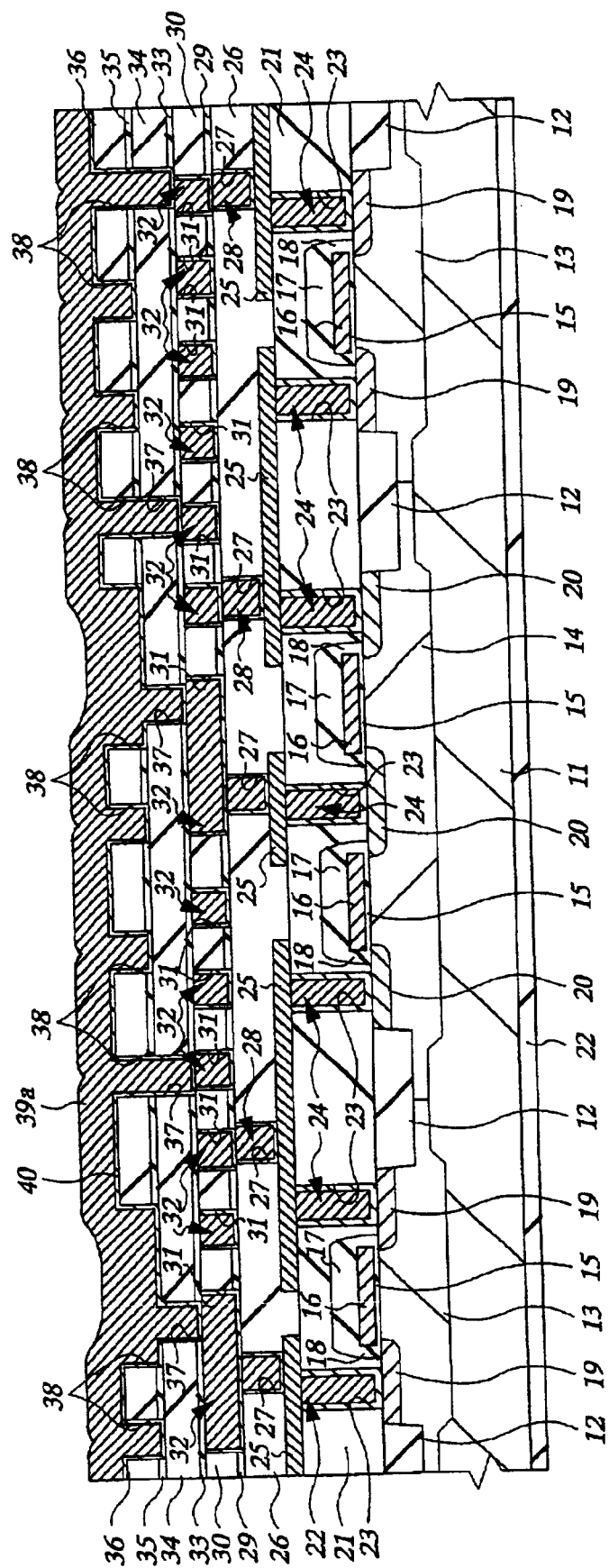
FIG. 21 is a cross-sectional view of a principal portion of a substrate showing a manufacturing method of a CMOS device that is embodiment 1.

First, as shown in FIG. 21, a barrier metal layer 40 is formed over the entire surface of the substrate 11 including both insides of the connection holes 37 and the wiring grooves 38. The barrier metal layer 40 is made of, for example, titanium nitride, tantalum, tantalum nitride or the like. Then, a copper seed layer (not illustrated) is formed on the barrier metal layer 40 through, for example, a CVD method or a sputtering method, and then a copper plated layer 39a is formed. Either method of electrolytic plating or electroless plating may be used as the above-mentioned plating method. Thereby, the connection holes 37 and the wiring grooves 38 are filled. Though formation of the copper film (the plated layer 39a) through a plating method is described above, the copper film may be formed through a sputtering method.

Figure 22:
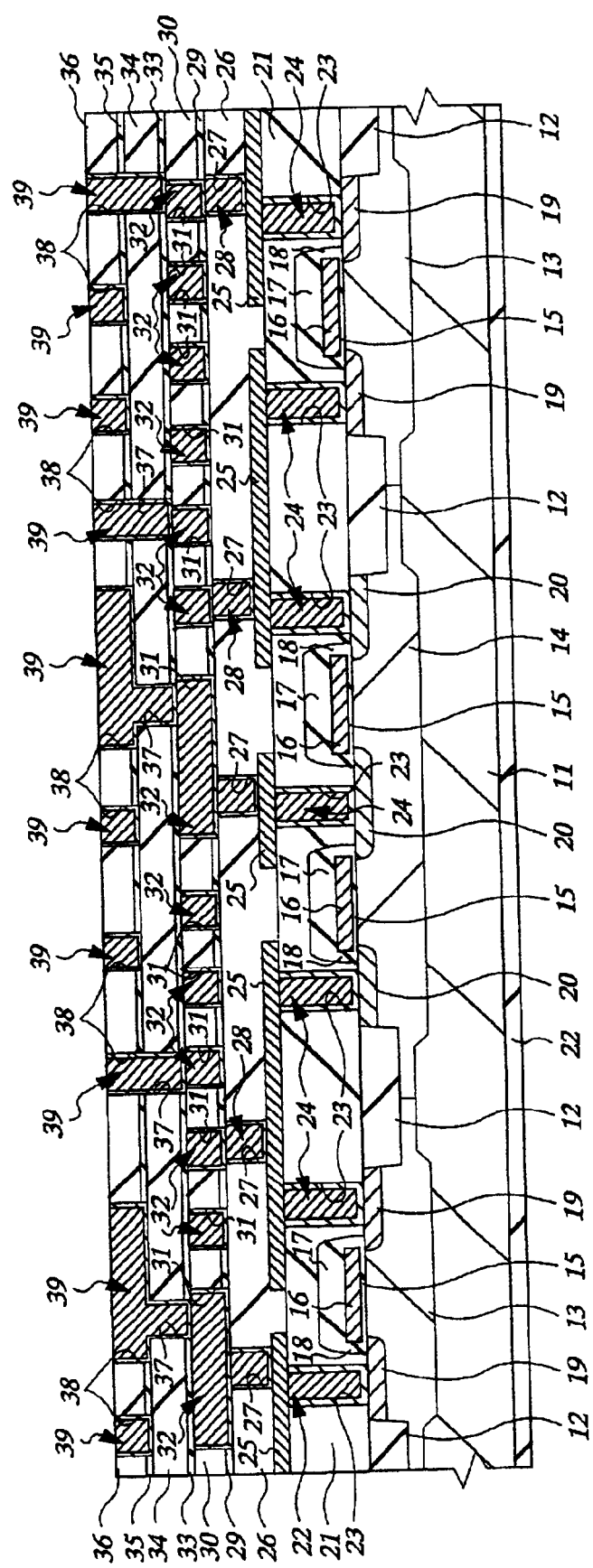
FIG. 22 is a cross-sectional view of a principal portion of a substrate showing a manufacturing method of a CMOS device that is embodiment 1.

Then, as shown in FIG. 22, the plated layer 39a and the seed layer are polished through a CMP method. Because copper requires a high polishing speed, the portion of copper is first removed. Moreover, the barrier metal layer 40 is also removed from the surface of the insulating film 36 by continuing polishing. Thereby, copper films (plated layer 39a and seed layer) and the barrier layer 40 are removed from areas other than the wiring grooves 38, and each wiring 39 is formed integrally with each connection member.

Figure 23:
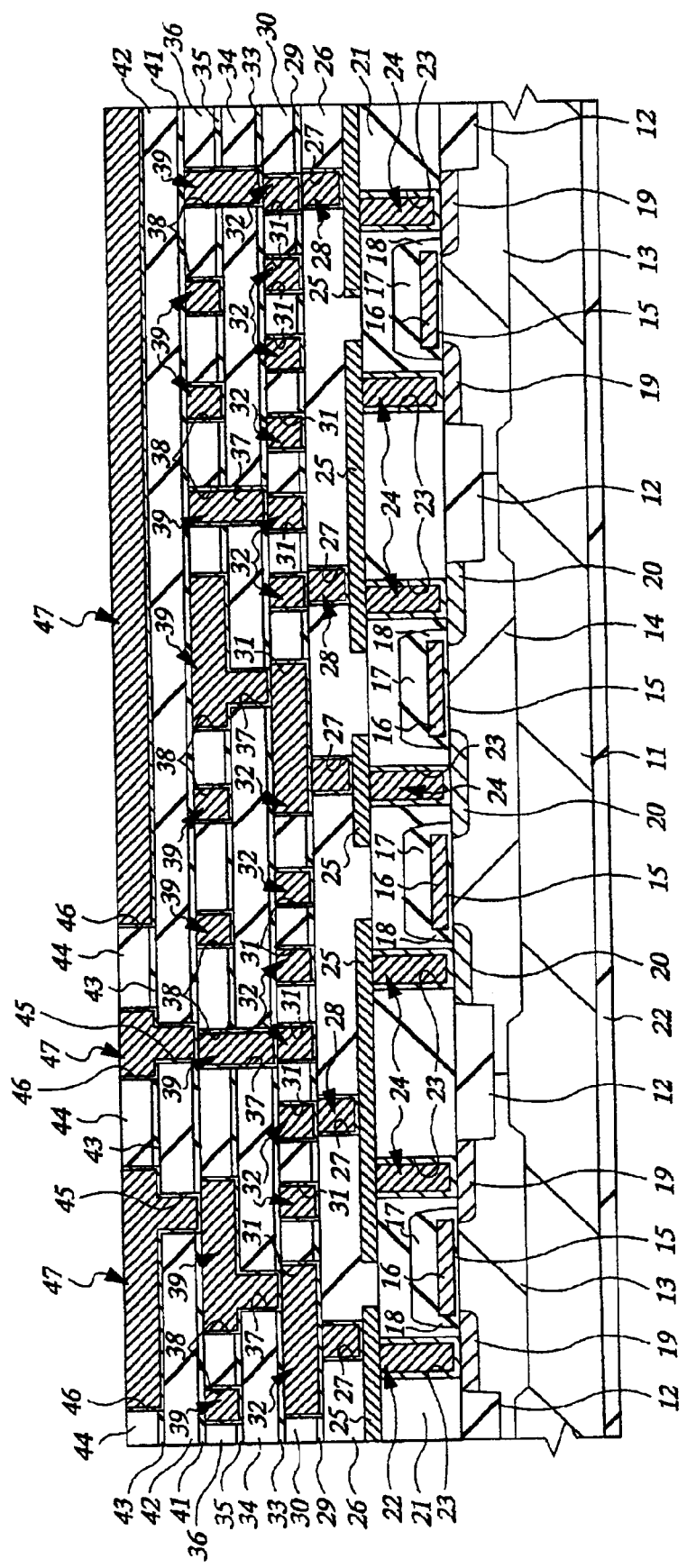
FIG. 23 is a cross-sectional view of a principal portion of a substrate showing a manufacturing method of a CMOS device that is embodiment 1.

Then, as shown in FIG. 23, a cap insulating film 41, an interlayer dielectric 42, a stopper insulating film 43 for forming wirings, and an insulating film 44 for forming wirings are formed in this order on the insulating film 36 and the wirings 39. These insulating films 41 to 44 are the same as the above-mentioned cap insulating film 33, the interlayer dielectric 34, the stopper insulting film 35 for forming wirings, and the insulating film 36 for forming wirings. Moreover, each connection hole 45 is formed in the cap insulating film 41 and the interlayer dielectric 42, and each wiring groove 46 is formed in the stopper insulating film 43 and the insulating film 44, similarly to the case of the third wiring layer described above. Furthermore, each fourth wiring layer 47 is formed integrally with each connection member similarly to the case of the wirings 39 of the third wiring layer.

Figure 24:
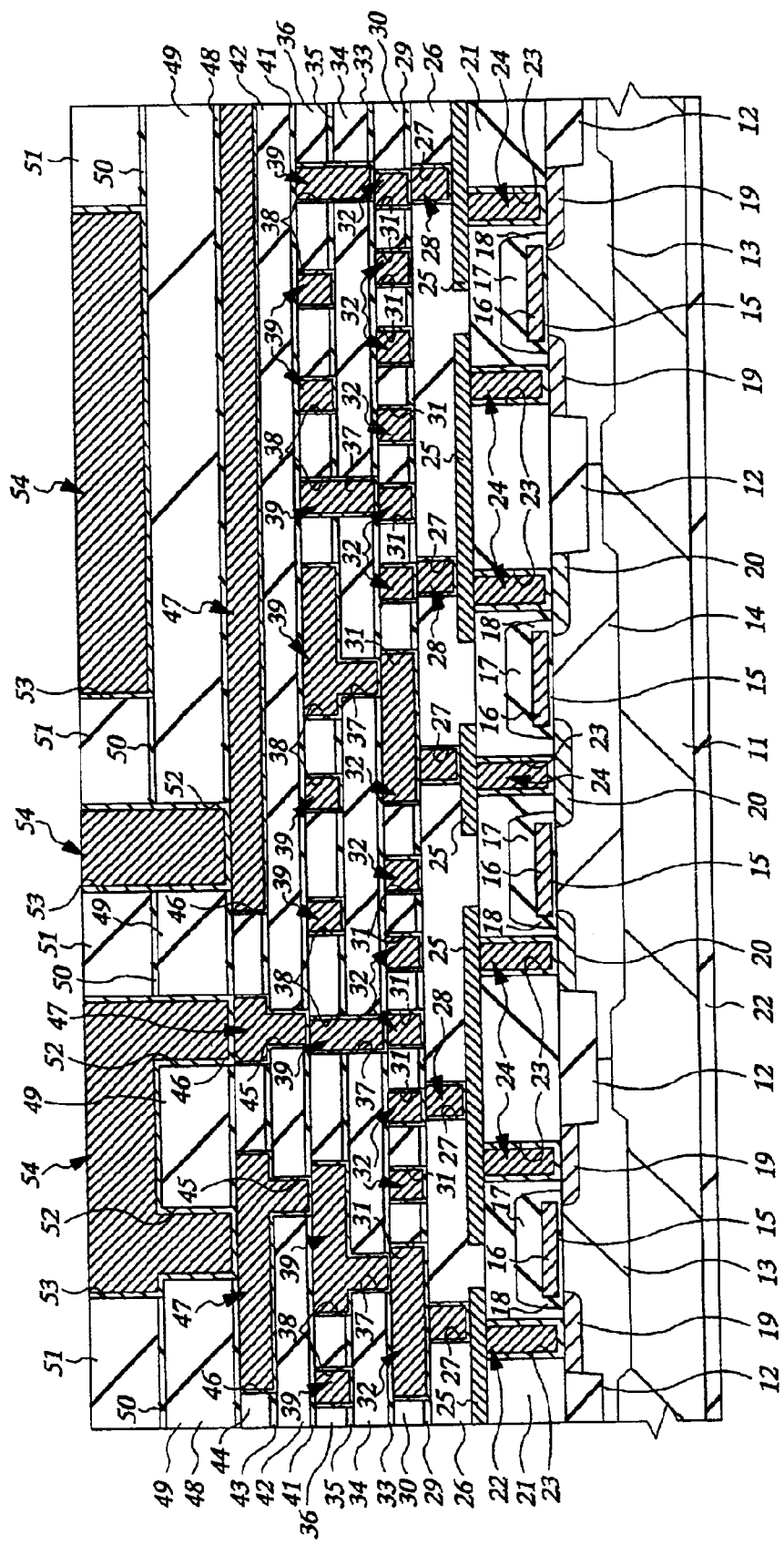
FIG. 24 is a cross-sectional view of a principal portion of a substrate showing a manufacturing method of a CMOS device that is embodiment 1.

Then, as shown in FIG. 24, a cap insulating film 48, an interlayer dielectric 49, a stopper insulating film 50 for forming wirings, and an insulating film 51 for forming wirings are formed in this order on the insulating film 44 and the wirings 47. These insulating films 48 to 51 are the same as the cap insulating film 33, the interlayer dielectric 34, the stopper insulating film 35 for forming wirings, and the insulating film 36 for forming wirings. Moreover, each connection hole 52 is formed in the cap insulating film 48 and the interlayer dielectric 49, and each wiring groove 53 is formed in the stopper insulating film 50 and the insulating film 51, similarly to the case of the third wiring layer. Furthermore, each wiring 54 of a fifth wiring layer is formed integrally with each connection member, similarly to the case of the wirings 39 of the third wiring layer.

Figure 25:
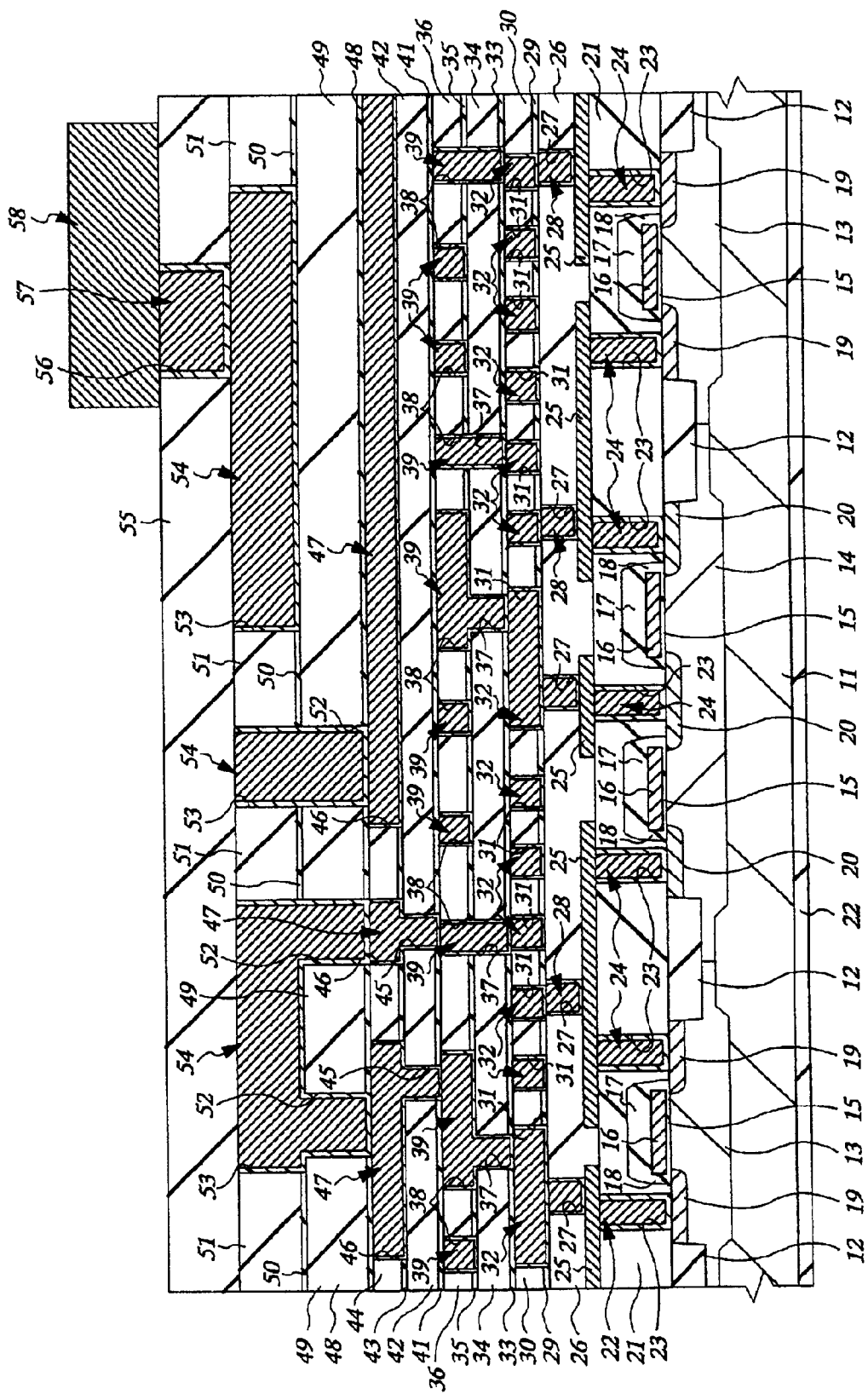
FIG. 25 is a cross-sectional view of a principal portion of a substrate showing a manufacturing method of a CMOS device that is embodiment 1.

Then, as shown in FIG. 25, an insulating film 55 is formed on the insulting film 51 and the wirings 54, and then a connection hole 56 reaching one wiring 54 is formed in the insulating film 55. The insulating film 55 is formed by a silicon oxide film or the like, which can be used as a TEOS oxide film formed through, for example, a plasma CVD method. Then, a titanium nitride film is formed over the entire surface of the substrate 11 including the inside of the connection hole 56 through, for example, a CVD method, and then a tungsten film embedded in the connection hole 56 is formed through, for example, a CVD method. Then, titanium nitride film and the tungsten film are removed from areas other than the connection hole 56 through, for example, a CMP method to form a plug 57.

Figure 26:
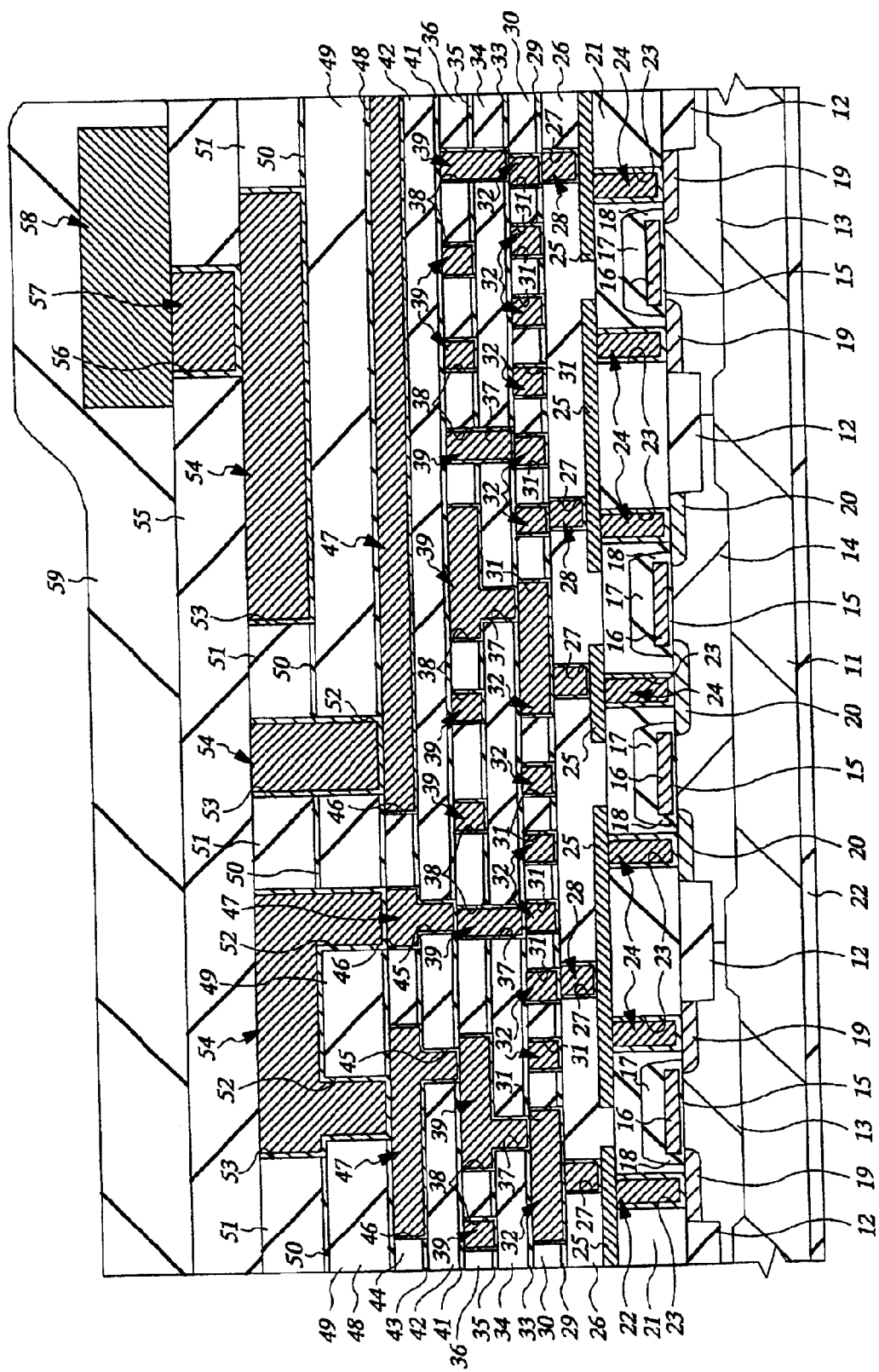
FIG. 26 is a cross-sectional view of a principal portion of a substrate showing a manufacturing method of a CMOS device that is embodiment 1.

Then, for example, an aluminum film or the like is formed over the entire surface of the substrate 11 and is dry-etched by using the patterned photoresist film as a mask, and thereby a wiring 58 of a sixth wiring layer which is the uppermost wiring is formed. Then, a CMOS device as shown in FIG. 26 is almost completed by covering the entire surface of the substrate 11 with a passivation film 59.

In the case of the above manufacturing method of the CMOS device, the first wiring layer is constituted by the wirings 25 formed by processing the tungsten film deposited over the substrate 11 through a dry-etching method. However, the first wiring layer may be constituted by forming the wiring grooves in the insulating film deposited over the substrate 11 and embedding the metallic film therein, that is, by the so-called damascene wirings. Or, the first wiring layer may be constituted by the so-called dual damascene wirings formed integrally with connection members. In this case, the first wiring layer is constituted by, for example, using copper as a main conductor layer.

Thus, according to the manufacturing method of CMOS device that is this embodiment 1, in the wiring-forming step executed later due to formation of the insulating film 22 on the back of the substrate 11 before the step of forming the first wiring layer, even if formation of various films through a plasma CVD method or a sputtering method and formations of connection holes and wiring grooves through a dry-etching method and the like are executed, then it is possible to suppress electric charges which are generated on the substrate 11 and which flow to the ground potential through the substrate 11. Therefore, it is possible to prevent damages to the substrate 11 due to charge-up, for example, breakdown of the gate insulating film 15 of a MISFET.

Moreover, by forming the insulating film 22 on the back of the substrate 11 before the CMP step of the silicon oxide film 21, it is possible to remove particles adhering to the surface of the substrate 11 at the time of forming the insulating film 22, in the CMP step of the above-mentioned silicon oxide film 21.

(Embodiment 2)

A manufacturing method of a CMOS device that is embodiment 2 will be described below by referring to cross-sectional views of principal portion of a substrate shown in FIGS. 27 to 30 in step order. First, an n-channel MISFET and a p-channel MISFET are formed in accordance with the same manufacturing method as the case of the above-mentioned embodiment 1, and then a silicon oxide film 21 is formed on the upper layers of the MISFETs. Then, an insulating film 22 is formed on the back of a substrate 11 and thereafter the surface of the silicon oxide film 21 is polished through, for example, a CMP method and the surface thereof is flattened. At the same time, particles are removed from the surface of the substrate 11. These steps are the same as those shown in FIGS. 11 to 17 for the embodiment 1.

Figure 27:
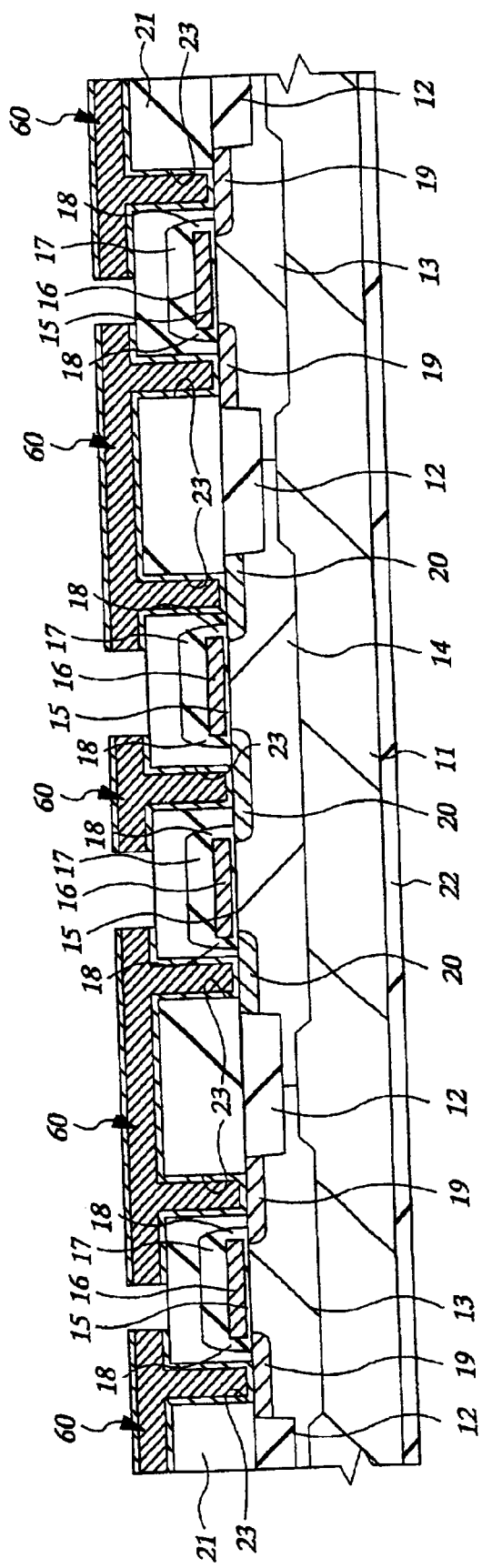
FIG. 27 is a cross-sectional view of a principal portion of a substrate showing a manufacturing method of a CMOS device that is embodiment 2.

Then, as shown in FIG. 27, each connection hole 23 is formed in the silicon oxide film 21 through a dry-etching method using a patterned photoresist film as a mask. Then, a lower-layer barrier film, an aluminum-alloy film, and an upper-layer barrier film are deposited in this order through, for example, a sputtering method, over the entire surface of the substrate 11 including the insides of the connection holes 23 and, thereafter the laminated film is processed through a dry-etching method using a patterned photoresist film as a mask to form a first wiring layer 60. The lower-layer and the upper-layer barrier films are formed by a tungsten film, a titanium nitride film, a tungsten titanium (TiW) film, molybdenum silicide ($MoSi_2$) or the like.

Figure 28:
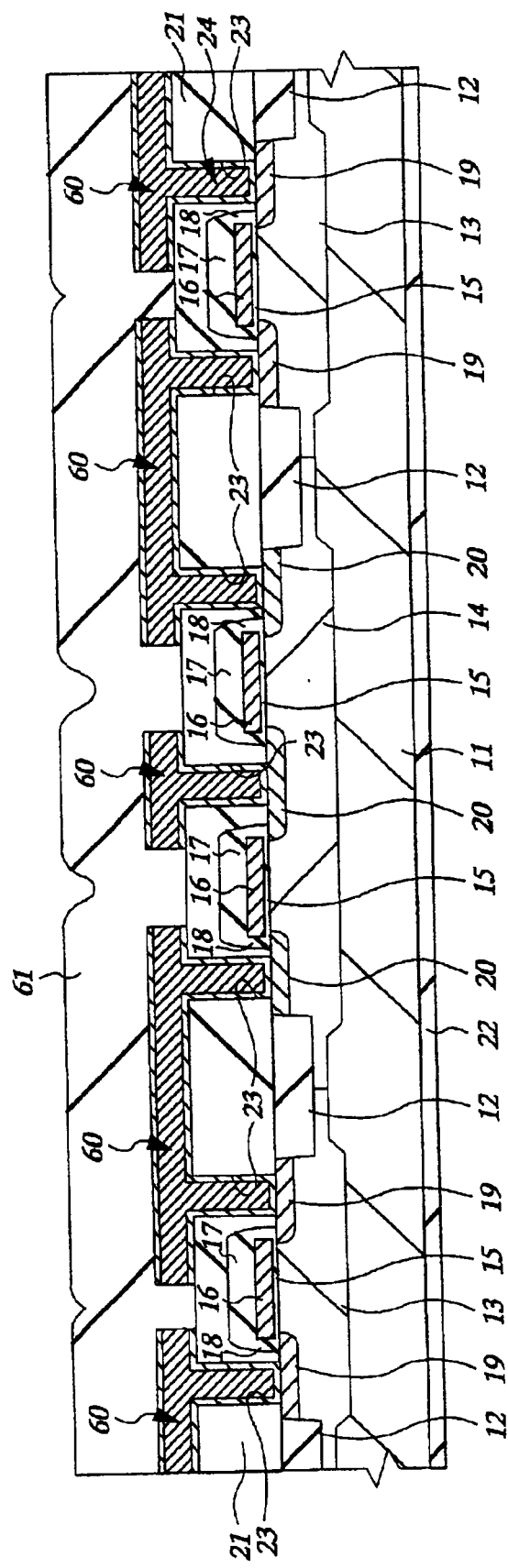
FIG. 28 is a cross-sectional view of a principal portion of a substrate showing a manufacturing method of a CMOS device that is embodiment 2.
Figure 29:
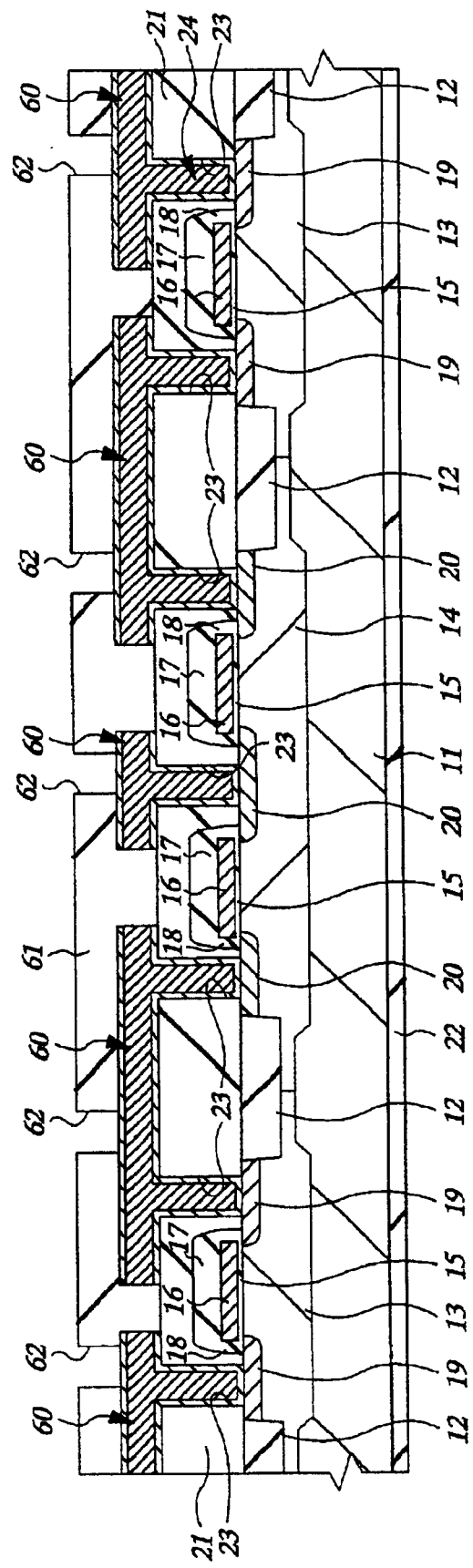
FIG. 29 is a cross-sectional view of a principal portion of a substrate showing a manufacturing method of a CMOS device that is embodiment 2.

Then, as shown in FIG. 28, an interlayer dielectric 61 is formed over the substrate 11. The interlayer dielectric 61 comprises, for example, a silicon oxide film, and is constituted by a TEOS oxide film deposited through a plasma CVD method using TEOS and oxygen as source gases. Moreover, as shown in FIG. 29, the interlayer dielectric 61 is polished through, for example, a CMP method and the surface thereof is flattened, and each connection hole 62 is formed in the interlayer dielectric 61 through a dry-etching method using a patterned photoresist film as a mask.

Figure 30:
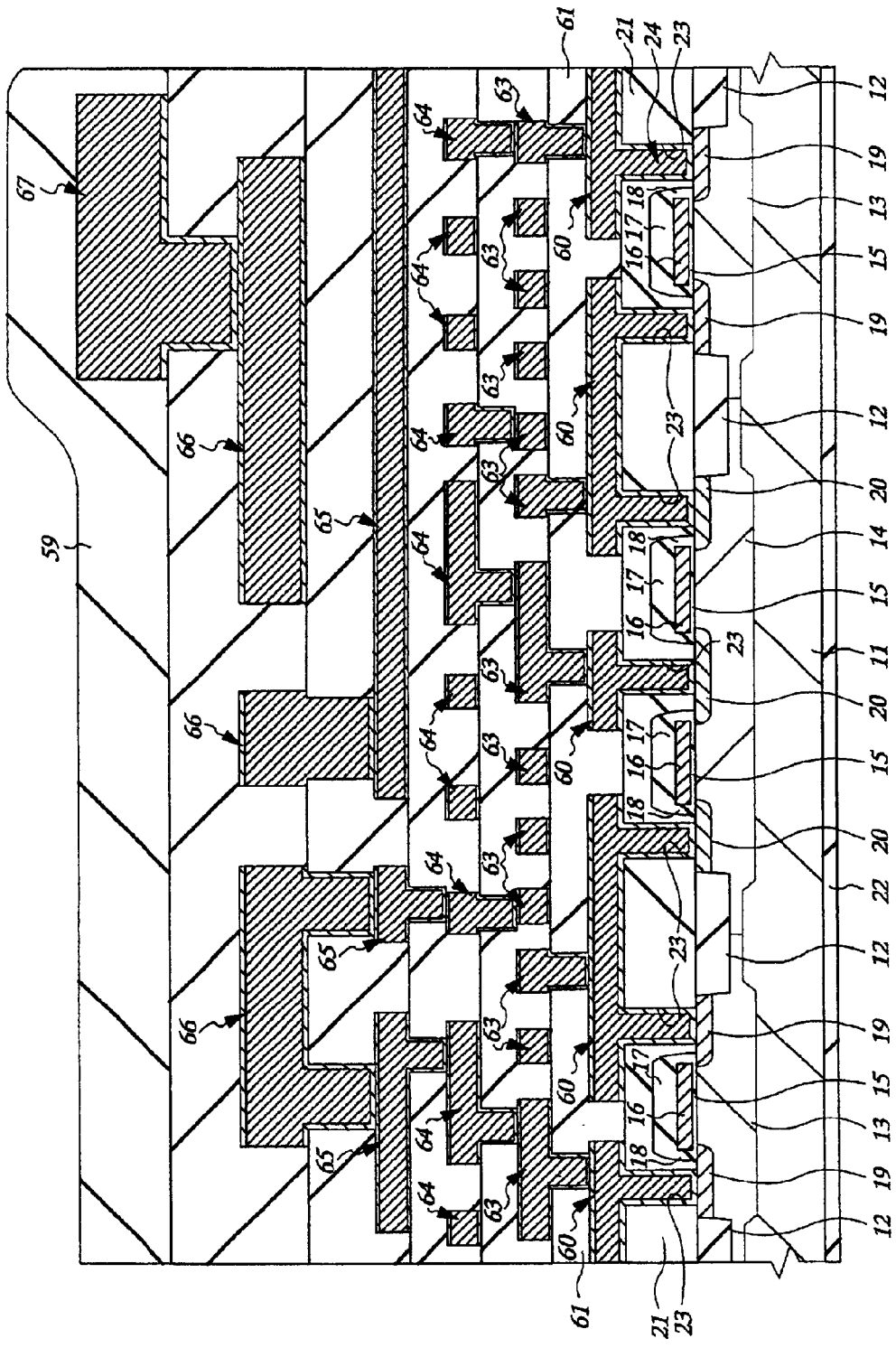
FIG. 30 is a cross-sectional view of a principal portion of a substrate showing a manufacturing method of a CMOS device that is embodiment 2.

Thereafter, the wirings 63 of a second wiring layer to the wiring 67 of a sixth wiring layer are formed by, for example, repeatedly forming metallic films (e.g. lower-layer barrier film, aluminum-alloy film, and upper-layer barrier film) through, for example, a sputtering method, an interlayer dielectric through a plasma CVD method, and connection holes through a dry-etching method in this order, and moreover the CMOS device shown in FIG. 30 is almost completed by covering the entire surface of the substrate 11 with a passivation film 59.

Thus, according to this embodiment 2, in the aluminum-wiring forming step using a dry-etching method, even if formation of various films through, for example, a plasma CVD method or a sputtering method and formations of wirings or connection holes through a dry-etching method and the like are executed, then it is possible to suppress electric charges which are generated on the substrate 11 and which flow to the ground potential through the substrate 11 because of the insulating film 22 formed on the back of the substrate 11.

(Embodiment 3)

A manufacturing method of a MOS device that is this embodiment 3 will be described below in step order by referring to cross-sectional views of a principal portion of a substrate shown in FIGS. 31 to 34. First, an n-channel MISFET and a p-channel MISFET are formed in accordance with the same manufacturing method as the case of the embodiment 1, and then a silicon oxide film 21 is formed over the upper layers of the MISFETs. These steps are the same as those shown in FIGS. 11 to 15 for the embodiment 1.

Figure 31:
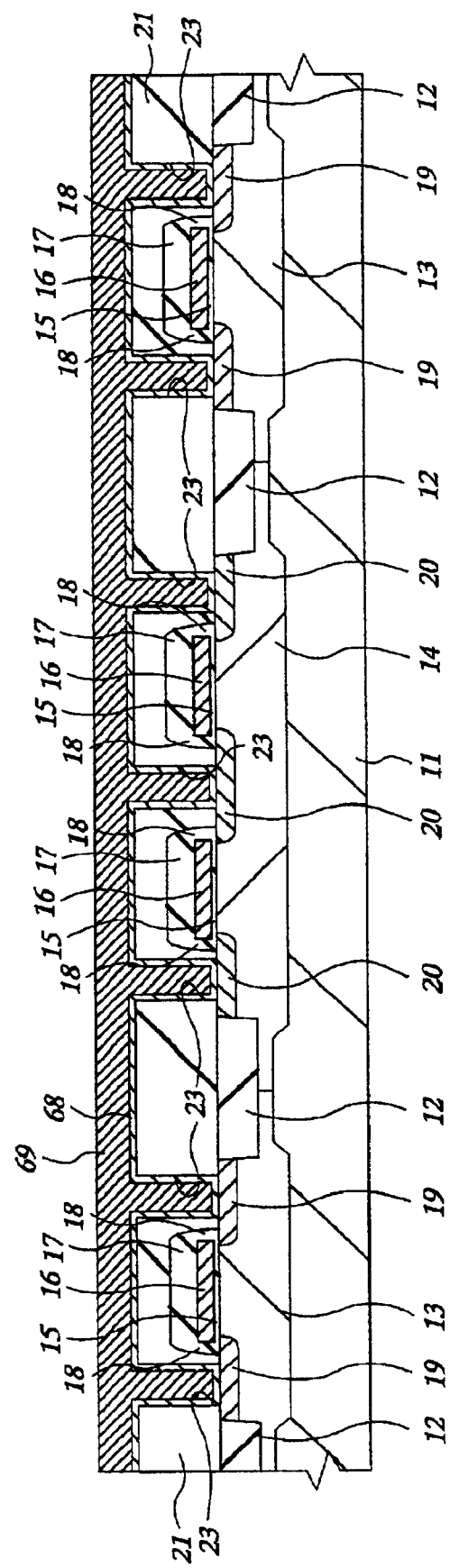
FIG. 31 is a cross-sectional view of a principal portion of a substrate showing a manufacturing method of a CMOS device that is embodiment 3.

Then, as shown in FIG. 31, the silicon oxide film 21 is polished through, for example, a CMP method and the surface thereof is flattened. Thereafter, each connection hole 23 is formed through a dry-etching method using a patterned photoresist film as a mask. Then, a titanium nitride film 68 (or titanium film) is formed over the entire surface of the substrate 11 including the insides of the connection holes 23 through, for example, a CVD method, and moreover a tungsten film 69 embedded in the connection holes 23 is formed through, for example, a thermal CVD method.

Figure 32:
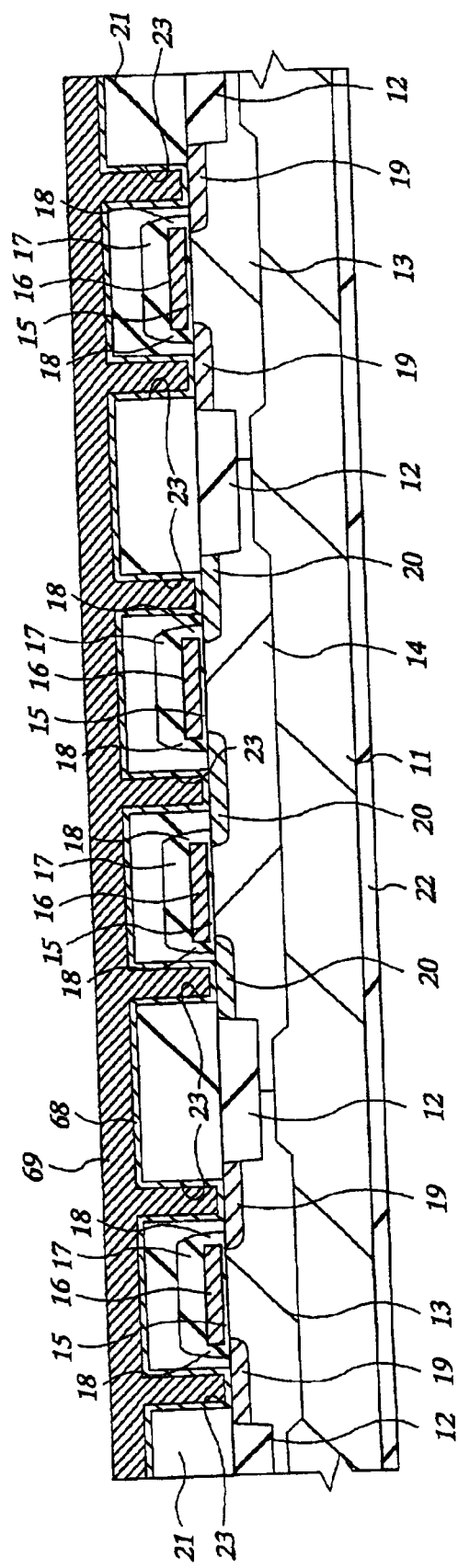
FIG. 32 is a cross-sectional view of a principal portion of a substrate showing a manufacturing method of a CMOS device that is embodiment 3.

Then, as shown in FIG. 32, an insulating film 22 having, for example, a thickness of about 300 nm is formed on the back of the substrate 11. The insulating film 22 can use a TEOS oxide film, silicon nitride film, silicon oxide film or the like deposited through a plasma CVD method. The insulating film 22 is formed by being set with its back turned upward in the susceptor of the reaction chamber of a single-wafer parallel-plate plasma system and by being flatly set, similarly to the method described in the above-mentioned embodiment 1. Thereby, the insulating film 22 is mainly formed on the back and the bevel portion of the substrate 11.

Figure 33:
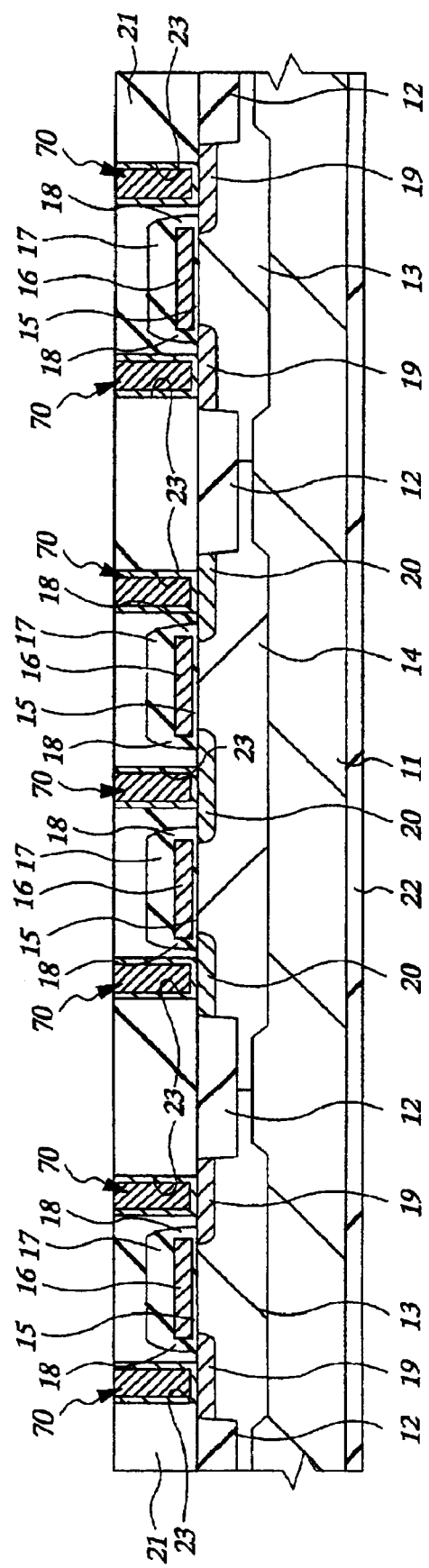
FIG. 33 is a cross-sectional view of a principal portion of a substrate showing a manufacturing method of a CMOS device which is embodiment 3.

Then, as shown in FIG. 33, each plug 70 is formed in the connection hole 23 by removing the titanium nitride film 68 and the tungsten film 69 from areas other than the connection holes 23 through, for example, a CMP method. At the same time, particles adhering to the surface of the substrate 11 (surface of the tungsten film 69) are removed. Moreover, a cleaning process may be performed before the surface of the tungsten film 69 is polished through a CMP method.

Figure 34:
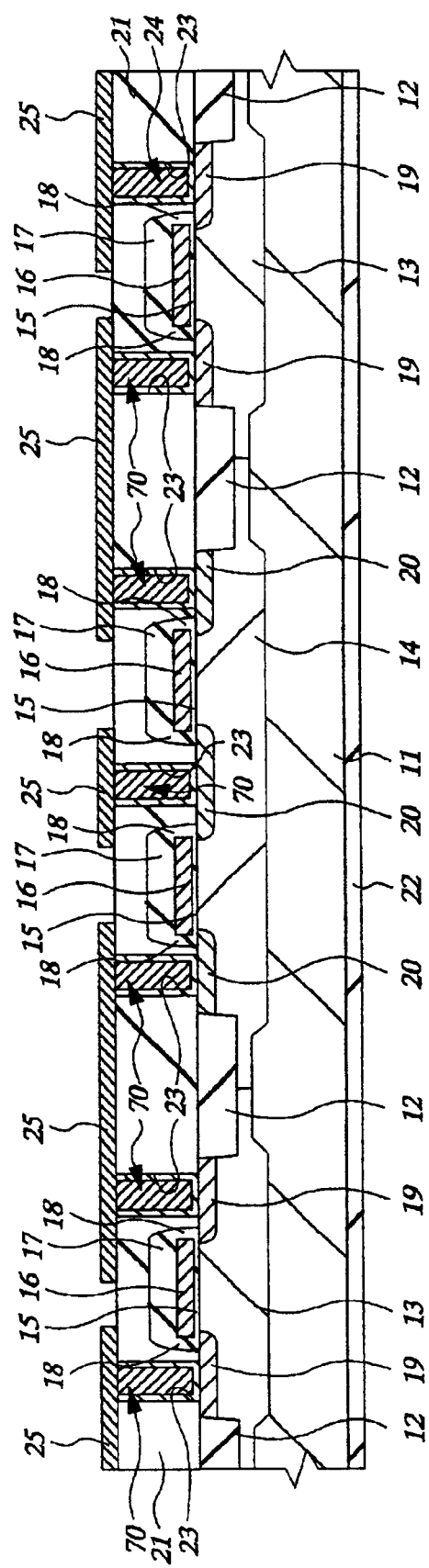
FIG. 34 is a cross-sectional view of a principal portion of a substrate showing a manufacturing method of a CMOS device that is embodiment 3.

Then, as shown in FIG. 34, wirings 25 of a first wiring layer are formed by forming a tungsten film over the entire surface of the substrate 11 through, for example, a CVD method or a sputtering method, and thereafter processing the tungsten film through a dry-etching method using a patterned photoresist film as a mask. By forming the wirings 25 of the first wiring layer, the antenna effect by the wirings 25 occurs. However, charge-up damages can be reduced, by the insulating film 22 formed on the back and the bevel portion of the substrate 11 before the CMP step for forming the plugs 70.

Thus, according to this embodiment 3, it is possible to suppress electric charges which are generated on the substrate 11 and which flow to the ground potential, by forming the insulating film 22 on the back of the substrate 11 before the CMP step for forming the plugs 70, and moreover to remove particles adhering to the surface of the substrate 11 in the CMP step for forming the above-mentioned plugs 70.

(Embodiment 4)

A manufacturing method of a CMOS device that is this embodiment 4 will be described below. First, an n-channel MISFET and a p-channel MISFET are formed in accordance with the same manufacturing method as the case of the above-mentioned embodiment 1, and then a silicon oxide film 21 is formed on the upper layers of the MISFETs. Then, an insulating film 22 is formed on the back of a substrate 11. These steps are the same as those shown in FIGS. 11 to 16 for the above-mentioned embodiment 1.

Then, when the substrate 11 is cleaned to form the insulating film 22 on the back of the substrate 11, particles adhering to the surface of the substrate 11 (surface of the silicon oxide film 21) are removed. The cleaning method can use, for example, a brushing method or an ultrasonic method. The steps executed later are the same as the case of the above-mentioned embodiment 1, in which the silicon oxide film 21 is polished through, for example, a CMP method and the surface thereof is flattened, and then plugs and a first wiring layer are formed.

In the case of the embodiment 4, steps of forming the insulating film 22 on the back of the substrate 11 and then cleaning the substrate 11 are executed before the CMP step of the silicon oxide film 21, but may be executed before the CMP step for forming the plugs 24, or after a step of forming a silicon oxide film constituting each sidewall spacer 18 on the substrate 11, or after a step of forming a polysilicon film each constituting each gate electrode 16 on the substrate 11.

Thus, according to the embodiment 4, it is possible to remove particles adhering to the surface of the substrate 11 in the above-mentioned cleaning step at the time of forming the insulating film 22 on the back of the substrate 11 by cleaning the substrate 11 after the insulating film 22 is formed on the back of the substrate 11.

Because general problems of plasma damages are described in Japanese Patent Application No. 2001-069013 (filed on Mar. 12, 2001) by the present inventors, they will not be described in detail.

Inventions having been made by the present inventors are specifically described above in accordance with the embodiments of the present invention. However, the present invention is not restricted to the embodiments described above, and, needless to say, various modifications of the present invention can be made without departing from the gist of the present invention.

For example, for the above embodiments, the case is described in which a CMOS device is used as a semiconductor device formed on the main surface of a substrate. However, the present invention is not restricted to the above case.

Advantages obtained from a typical invention among inventions disclosed in this application will be briefly described below.

By forming the insulating film on the back of the substrate before the wiring-forming step, even if a plasma CVD method, a sputtering method, or a dry-etching method is executed in the wiring-forming step, then it is possible to suppress, by the above-mentioned insulating film, electric charges which are generated on the surface and which flow to the ground potential through the substrate. Therefore, it is possible to prevent damages to a substrate due to charge-up, for example, such as breakdown of the gate insulating film of a MISFET.

What is claimed is:

1. A manufacturing method of a semiconductor device, comprising the steps of:
   (a) forming a first insulating film on a first main surface of a substrate;
   (b) forming a second insulating film on a second main surface of said substrate;
   (c) polishing a surface of said first insulating film through a CMP method to remove particles disposed thereon after said step (b); and
   (d) forming a wiring layer over the first main surface of said substrate through a plasma treatment after said step (c).

2. The manufacturing method of a semiconductor device according to claim 1,
   wherein said second insulating film is formed on one of the whole area and a partial area of the second main surface of said substrate.

3. The manufacturing method of a semiconductor device according to claim 2,
   wherein said second insulating film is one of a TEOS oxide film, a silicon nitride film, and a silicon oxide film formed through a plasma CVD method.

4. The manufacturing method of a semiconductor device according to claim 2,
   wherein said second insulating film has a thickness of about 100 nm or more.

5. The manufacturing method of a semiconductor device according to claim 2,
   wherein said first insulating film covers a gate insulating film and a gate electrode of a MISFET formed over the first main surface of said substrate.

6. The manufacturing method of a semiconductor device according to claim 1,
   wherein a cleaning process of said substrate is performed before said step (c).

7. The manufacturing method of a semiconductor device according to claim 6,
   wherein said cleaning process is preformed by one of a brushing system and an ultrasonic system.

8. A manufacturing method of a semiconductor device, comprising the steps of:
   (a) forming a first insulating film on a first main surface of a substrate;
   (b) forming a second insulating film on a bevel portion of said substrate;
   (c) polishing a surface of said first insulating film through a CMP method to remove particles disposed thereon after said step (b); and
   (d) forming a wiring layer over the first main surface of maid substrate through a plasma treatment after said step (c).

9. The manufacturing method of a semiconductor device according to claim 8,
   wherein said second insulating film is formed on one of the whole area and a partial area of the bevel portion of said substrate.

10. The manufacturing method of a semiconductor device according to claim 9,
    wherein maid second insulating film is one of a TEOS oxide film, a silicon nitride film, and a silicon oxide film formed through a plasma CVD method.

11. The manufacturing method of a semiconductor device according to claim 9,
    wherein said second insulating film has a thickness of about 100 nm or more.

12. The manufacturing method of a semiconductor device according to claim 9,
    wherein said first insulating film covers a gate insulating film and a gate electrode of a MISFET formed over the first main surface of said substrate.

13. A manufacturing method of a semiconductor device, comprising the stops of:
    (a) forming a first insulating film on a first main surface of a substrate;
    (b) forming a second insulating film on a second main surface and a bevel portion of said substrate;
    (c) polishing a surface of said first insulating film through a CMP method to remove particles disposed thereon after said step (b); and
    (d) forming a wiring layer over the first main surface of said substrate through a plasma treatment after said step (c).

14. The manufacturing method of a semiconductor device according to claim 13,
    wherein the second insulating film is formed on one of the whole areas of the second main surface and the bevel portion of said substrate; the whole area of the second main surface and a partial area of the bevel portion of said substrate; a partial area of the second main surface and the whole area of the bevel portion of said substrate; and partial areas of the second main surface and the bevel portion of said substrate.

15. The manufacturing method of a semiconductor device according to claim 14,
    wherein said second insulating film is one of a TEOS oxide film, a silicon nitride film, and a silicon oxide film formed through a plasma CVD method.

16. The manufacturing method of a semiconductor device according to claim 14, wherein said second insulating film has a thickness of about 100 nm or more.

17. The manufacturing method of a semiconductor device according to claim 14, wherein said first insulating film covers a gate insulating film and a first gate electrode of a MISFET formed over the first main surface of said substrate.

18. The manufacturing method of a semiconductor device according to claim 13, wherein a cleaning process of said substrate is performed before said step (c).

* * * * *